United States Patent [19]

Sauer

[11] Patent Number: 5,272,481
[45] Date of Patent: Dec. 21, 1993

[54] SUCCESSIVE APPROXIMATION ANALOG TO DIGITAL CONVERTER EMPLOYING PLURAL FEEDBACK DIGITAL TO ANALOG CONVERTERS

[75] Inventor: Donald J. Sauer, Allentown, N.J.

[73] Assignee: David Sarnoff Research Center, Inc., Princeton, N.J.

[21] Appl. No.: 929,211

[22] Filed: Aug. 13, 1992

Related U.S. Application Data

[63] Continuation-in-part of Ser. No. 724,637, Jul. 2, 1991.

[51] Int. Cl.⁵ .............................................. H03M 1/38
[52] U.S. Cl. ..................................... 341/165; 307/355
[58] Field of Search ............... 341/163, 164, 165, 161; 307/350, 355, 356, 357

[56] References Cited

U.S. PATENT DOCUMENTS

| | | | |
|---|---|---|---|
| 4,228,423 | 10/1980 | Schwerdt | 341/118 |
| 4,262,221 | 4/1981 | Dingwall | 307/388 |
| 4,385,286 | 5/1983 | Haque | 340/347 |
| 4,498,072 | 2/1985 | Moriyama | 341/163 X |
| 4,553,128 | 11/1985 | Pilost | 341/161 |
| 4,553,128 | 11/1985 | Pilost | 340/347 |
| 4,598,269 | 7/1986 | Penney | 341/118 |
| 4,620,179 | 10/1986 | Cooper et al. | 340/347 |
| 4,691,189 | 9/1987 | Dingwall | 340/347 |
| 4,764,750 | 8/1988 | Kawada | 341/163 |
| 4,940,981 | 7/1990 | Naylor et al. | 341/161 |
| 4,989,003 | 1/1991 | Sauer | 341/136 |
| 4,999,633 | 3/1991 | Draxelmayr | 341/120 |
| 5,010,338 | 4/1991 | Miki et al. | 341/159 |
| 5,028,926 | 7/1991 | Tokuhiro | 341/161 |
| 5,032,744 | 7/1991 | Liu | 307/491 |
| 5,065,045 | 11/1991 | Mok | 307/355 |
| 5,136,183 | 8/1992 | Moyal et al. | 307/355 |

*Primary Examiner*—Marc S. Hoff
*Attorney, Agent, or Firm*—William J. Burke

[57] ABSTRACT

There is disclosed an ADC including a comparator which sets, bit-by-bit, a successive approximation binary register. Feedback means for auto-biasing, auto-calibration, and offset compensation within the ADC are provided. The ADC sets itself to a high degree of accuracy automatically by reference to a master voltage reference. A number of identical ADCs are connected in parallel to provide an increased sampling rate. The ADC architecture compensates for component tolerance differences, for common mode noise, and for secondary parasitic effects. The ADC operates with high resolution at high speed (e.g., 10 bits at 50 MHz), and can be implemented in MOS technology with good circuit yield and is compatible with ASICs.

16 Claims, 16 Drawing Sheets

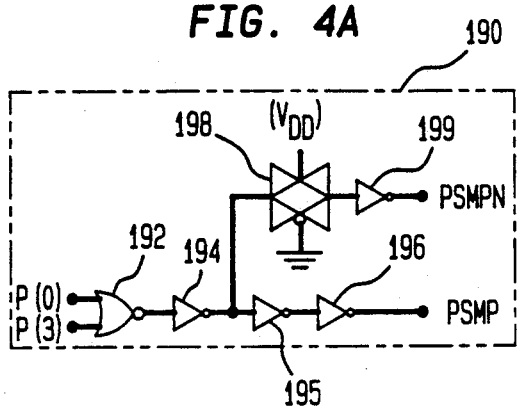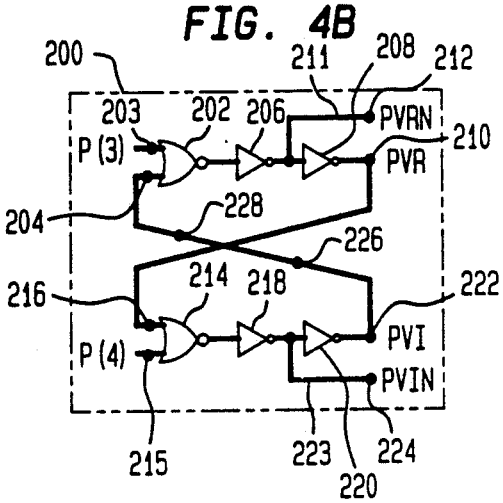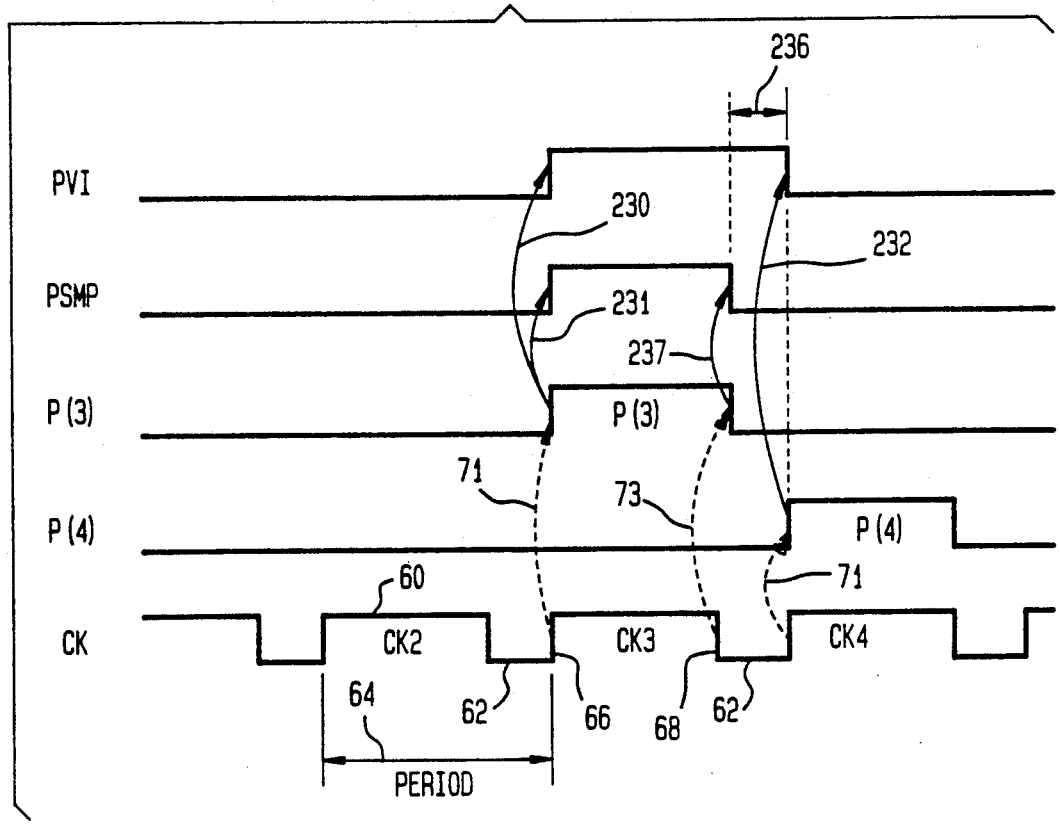

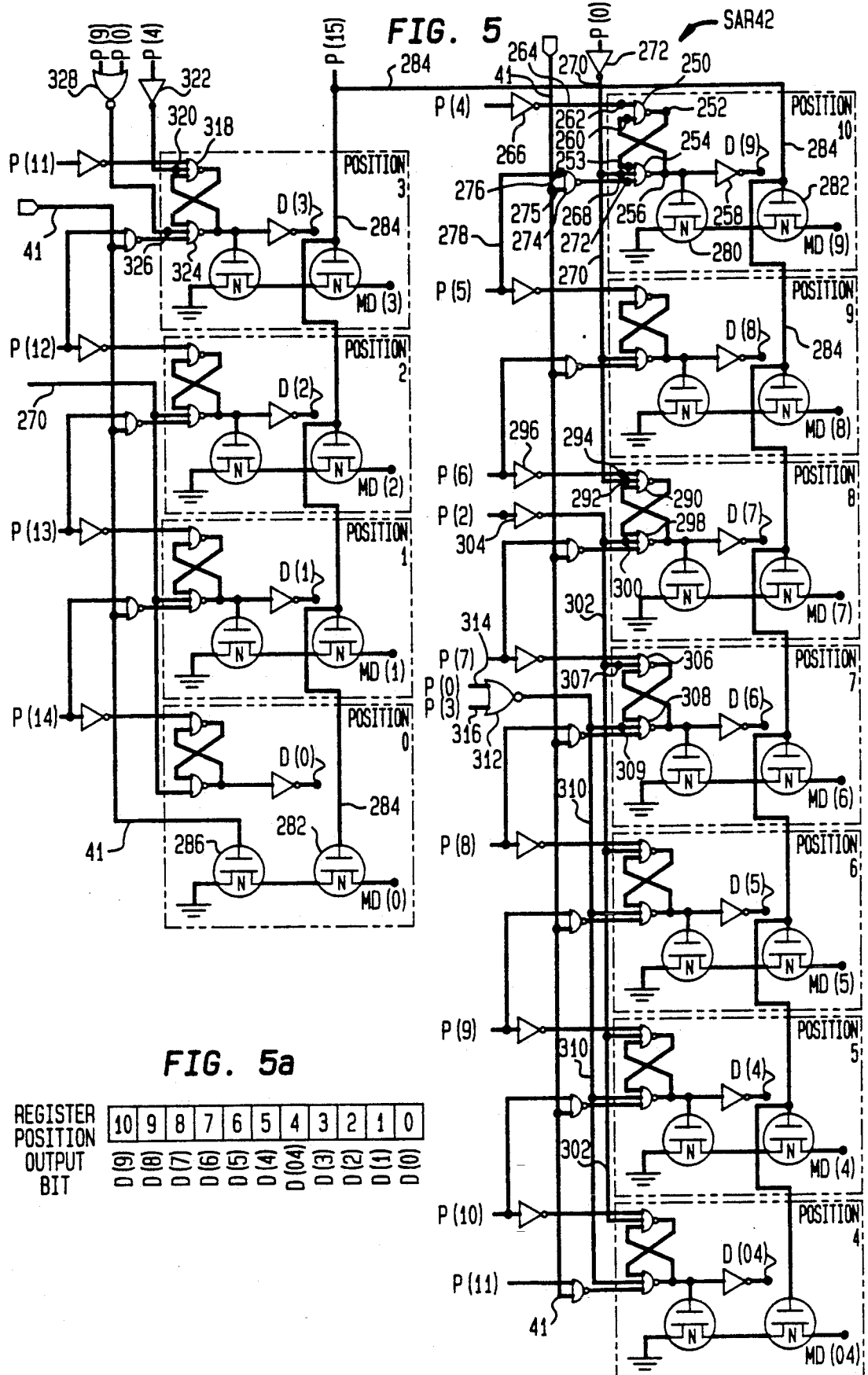

FIG. 7

SAR POSITIONS (CORRESPONDING TO FIG'S 5 AND 5A)

| PHASES | 10 | 9 | 8 | 7 | 6 | 5 | 4 | 3 | 2 | 1 | 0 |
|---|---|---|---|---|---|---|---|---|---|---|---|
| P(0)  | 0   | 0   | 1   | 0   | 0   | 0   | 0   | 0 | 0   | 0   | 0   |
| P(1)  | 0   | 0   | 1   | 0   | 0   | 0   | 0   | 0 | 0   | 0   | 0   |
| P(2)  | 0   | 0   | 0   | 1   | 1   | 1   | 1   | 0 | 0   | 0   | 0   |
| P(3)  | 0   | 0   | 0   | 0   | 0   | 0   | 0   | 0 | 0   | 0   | 0   |
| P(4)  | 1/S | 0   | 0   | 0   | 0   | 0   | 0   | 1 | 0   | 0   | 0   |
| P(5)  | S   | 1/S | 0   | 0   | 0   | 0   | 0   | 1 | 0   | 0   | 0   |
| P(6)  | S   | S   | 1/S | 0   | 0   | 0   | 0   | 1 | 0   | 0   | 0   |
| P(7)  | S   | S   | S   | 1/S | 0   | 0   | 0   | 1 | 0   | 0   | 0   |
| P(8)  | S   | S   | S   | S   | 1/S | 0   | 0   | 1 | 0   | 0   | 0   |
| P(9)  | S   | S   | S   | S   | S   | 1/S | 0   | 0 | 0   | 0   | 0   |
| P(10) | S   | S   | S   | S   | S   | S   | 1/S | 0 | 0   | 0   | 0   |
| P(11) | S   | S   | S   | S   | S   | S   | S   | 1/S | 0 | 0   | 0   |
| P(12) | S   | S   | S   | S   | S   | S   | S   | S | 1/S | 0   | 0   |
| P(13) | S   | S   | S   | S   | S   | S   | S   | S | S   | 1/S | 0   |
| P(14) | S   | S   | S   | S   | S   | S   | S   | S | S   | S   | 1/S |
| P(15) | S   | S   | S   | S   | S   | S   | S   | S | S   | S   | S   |

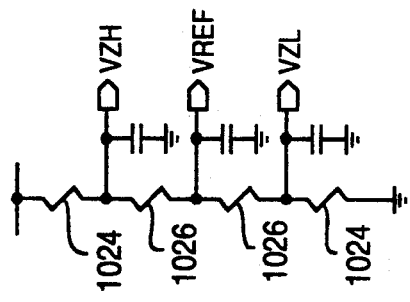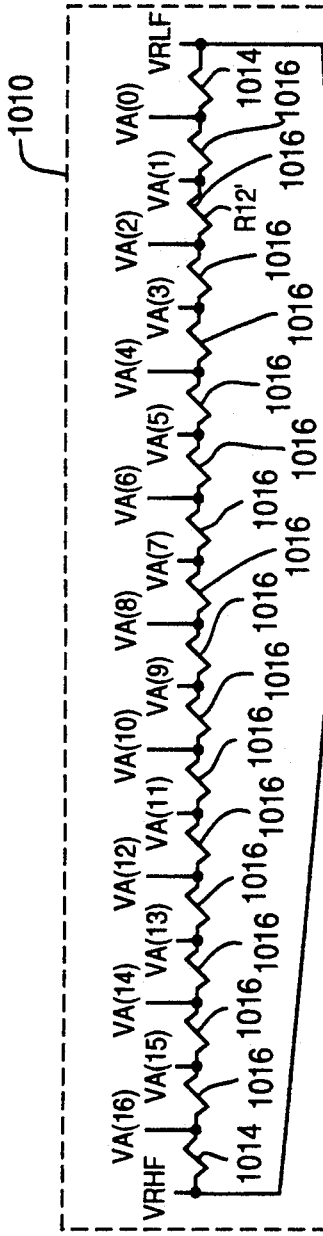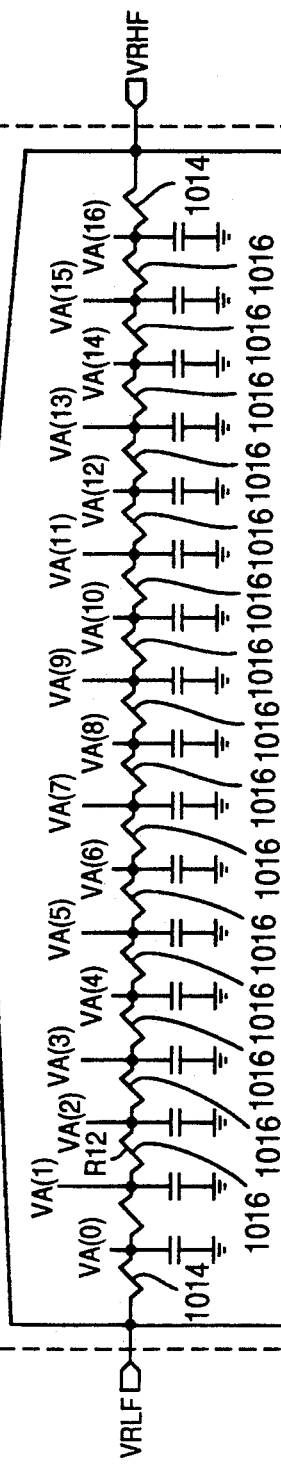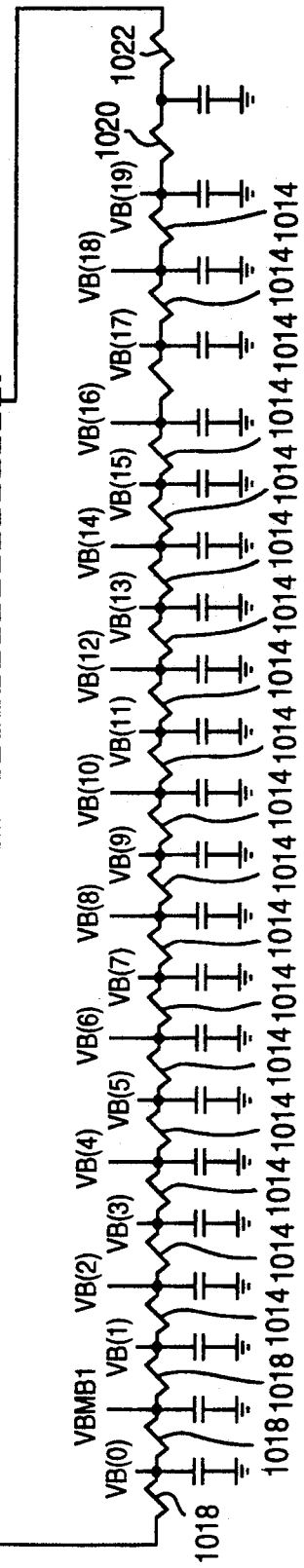
FIG. 10b
FIG. 10a

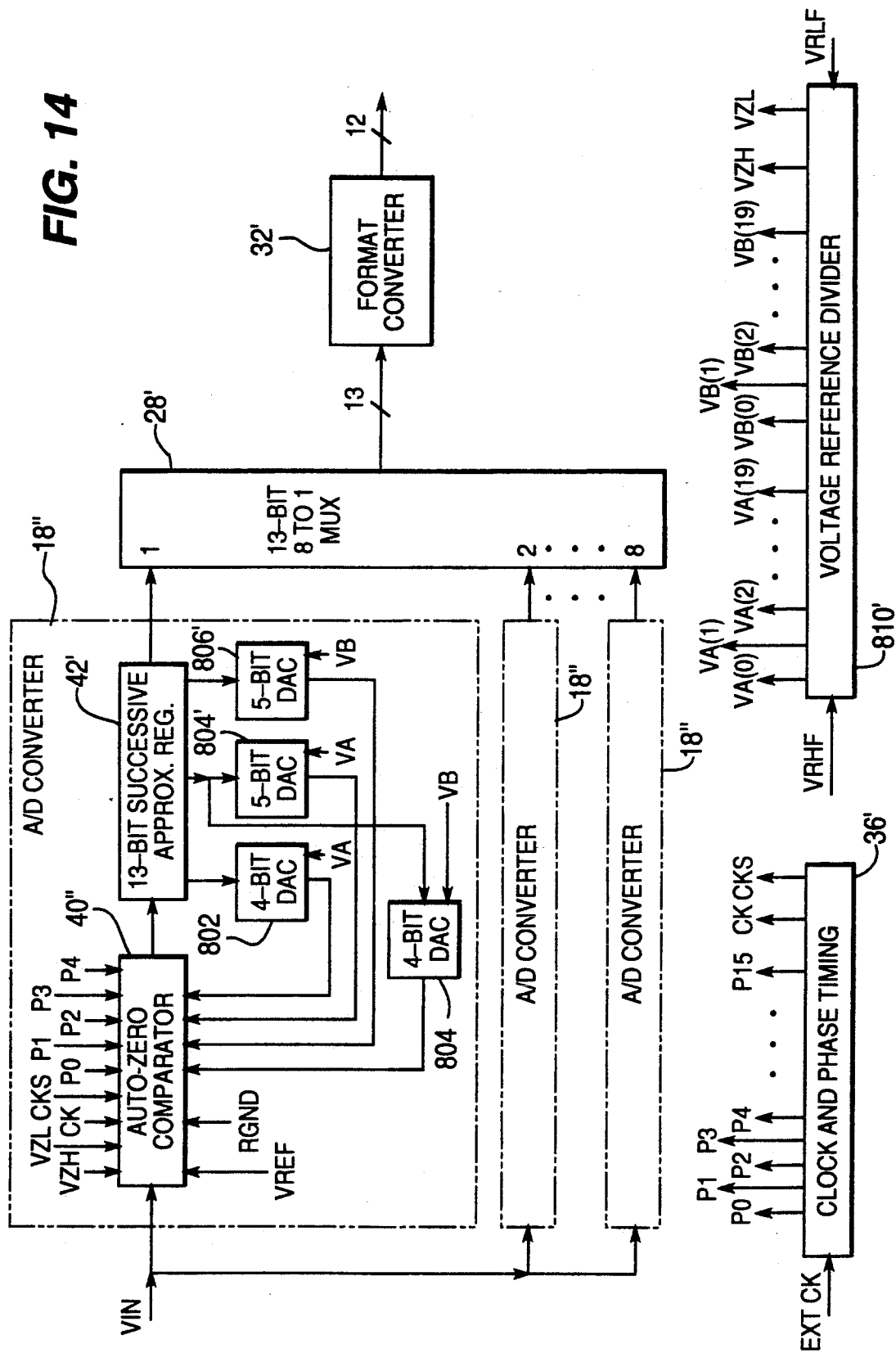

SUCCESSIVE APPROXIMATION ANALOG TO DIGITAL CONVERTER EMPLOYING PLURAL FEEDBACK DIGITAL TO ANALOG CONVERTERS

This application is a continuation-in-part of U.S. patent application Ser. No. 07/724,637 filed on Jul. 2, 1991.

FIELD OF THE INVENTION

The invention relates to an analog to digital converter (ADC) which operates at high speed and provides high resolution, and more particularly, to an ADC which can be made using metal oxide semiconductor (MOS) technology to obtain very high performance with low power requirements and low cost.

BACKGROUND OF THE INVENTION

In digital signal processing it is necessary to convert an analog signal into a digital format. To insure reasonable fidelity in this conversion, it is desirable to sample the analog signal at a rate substantially greater than analog signal bandwidth. These sampled signal values are then converted sample by sample at high speed into their equivalent digital values represented by N number of binary bits. Prior art ADCs, which typically use bipolar transistors, are able to operate at high rates (e.g., 50 MHz) and with 10-bit resolution. These ADCs require relatively large amounts of power and are very costly. On the other hand, attempts to implement high speed, multi-bit ADCs with MOS technology have not been as successful as desired. Either cost was high because of poor chip yield or performance was substantially less than could be obtained using bipolar transistor technology.

One of the problems in implementing a high speed ADC in MOS technology is that of noise caused by induced currents in the silicon substrate of a MOS chip. To some extent this problem can be minimized by careful shielding, by the separation and isolation of power supply busses, and by the use of complementary metal oxide semiconductor (CMOS) transistors, that is, n-channel and p-channel MOS transistors (NMOS and PMOS). However, the presence of residual noise, switching transients, stray capacity, etc., impose certain design constraints and other limitations on the sensitivity and sampling speed of an ADC using MOS technology as discussed in my U.S. Pat. No. 4,989,003.

Another problem is that the individual transistors and capacitors in a MOS circuit may have values of threshold voltage, capacitance, etc., which can vary by as much as 10%. These variations make it extremely difficult to build a high speed, precision ADC requiring closely matched components, without the use of component trimming, which is costly, and without the use of switched capacitor auto-zero input circuitry which causes large input switching transients.

An N-flash ADC, simultaneously produces N data bits in parallel from a sampled analog voltage. The ADC comprises $2^N - 1$ comparators which are closely matched to each other with each capable of high resolution. The ADC circuit momentarily connects all of these comparators at once to an input signal circuit. This input switching is used in conventional MOS comparator circuitry which uses switched capacitor auto-zero input circuitry to compensate for relatively large MOS threshold voltage offsets. A decoder circuit coupled to all of the comparators then determines the values of the N bits corresponding to the analog value of the input signal being sampled at that instant. An advantage of this type of ADC is the high speed at which it can operate. An important disadvantage is the relatively low impedance load (and corresponding large switching transients) caused by connecting all of the comparators to the input circuit at the same time. As an example, for a 10 bit output ADC (where N equals 10) the number of comparators is 1023! Thus the applied load represented by all the comparators connected in parallel is hundreds of times greater than that of a single comparator alone, giving rise to undesirably large switching transients. An important reason for reducing the magnitude of these switching transients is that the recovery time from these transients sets the upper limit on the sampling rate of the ADC. This undesirable condition is aggravated in MOS technology where the input source impedance levels are inherently high, causing switching transients to be more pronounced than with bipolar technology.

A serial ADC, samples an analog signal and then bit-by-bit determines the digital value of the sample. A single comparator in the ADC is used to determine all of the bit values. This single comparator presents a smaller load and thus reduced switching transients compared to an N-flash ADC. The speed of a serial ADC, however, is relatively low because of the time taken in the sequential determination of the bit values of the digital output. Thus to produce a 10-bit value, a serial ADC may run at only one-tenth the speed of a 10-bit N-flash ADC. It will thus be appreciated that the requirement for high speed in an ADC may conflict in important ways with the requirement for high resolution; and that the desire for low cost, through the use of MOS technology, may conflict with the desire for high performance.

It is desirable to have a high speed and relatively low cost ADC formed on a semiconductor substrate using MOS technology which may be integrated with digital MOS circuitry on the same semiconductor substrate.

SUMMARY OF THE INVENTION

The invention provides a highly effective and efficient new architecture for an ADC. This ADC is readily implemented in MOS technology (e.g., standard one-micron N-well manufacturing technology) either as a stand-alone unit or as a sub-module of a larger application-specific integrated circuit (ASIC). Thus the new ADC can be manufactured at very low cost compared to previous ADCs. A number of unique design features enable this new ADC to operate at high speed with high resolution (e.g., 10-bits), with good immunity to noise, and with very low power requirements. The unique architecture of this new ADC also substantially improves yield of chips which further lowers cost.

A high performance serial ADC is implemented through novel architecture including a novel high speed comparator circuit having balanced PMOS and NMOS transistors by which a high degree of common-mode noise immunity is obtained. The comparator circuit includes an active feedback loop by which the comparator continually and automatically biases itself to an accurately determined switching point which is continually referenced to a master voltage reference. A desired switching sensitivity at a desired switching voltage level point is obtained by the auto-bias action even though the PMOS and NMOS transistors and associated coupling capacitors are not exactly matched, with age or with time. Unwanted errors caused by parasitic capacitive coupling at terminals within the comparator are substantially eliminated by the action of this auto-bias loop. The register has a unique arrangement of N+1 bit positions, corresponding to the N bits in a digitized signal plus an extra bit used for switching offset compensation. The extra offset-compensation bit, reduces the requirements for the settling time (resulting from an RC time constant) in the input circuitry of the comparator, and so enables the comparator to operate at much higher speed than otherwise.

In another embodiment of the invention, a gain adjust circuit is provided as part of the auto-calibration loop. This circuit applies a variable attenuation factor to the input voltage to compensate for errors in the most significant (MSB) and least significant bit (LSB) DACs.

Identical ones of these new ADCs are arranged in a parallel assembly of closely adjacent multiple ADCs. An integer I clock phases, synchronized to an external clock, are employed. An integer J, less than I, of these phase counts are used by the ADC for auto-zeroing, auto-calibration, signal sampling and digital output multiplexing. The remaining I-J phase counts are used in determining the output data bits and to accommodate the one offset bit.

BRIEF DESCRIPTION OF THE DRAWING

FIG. 4A shows a circuit for obtaining the timing signals PSMP and PSMPN as used in FIG. 3;

FIG. 4B shows a circuit for obtaining the timing signals PVR, PVRN and the signals PVI and PVIN;

FIG. 4C shows a timing relationship of PVI to PSMP and phases P(3) and P(4).

FIG. 5 is a circuit diagram of a SAR of an ADC of FIG. 1;

FIG. 5A is a schematic representation of the bit positions of the SAR in FIG. 5;

FIG. 7 is a chart showing the sequence of operation of one of the ADCs of FIG. 1;

FIGS. 10a and 10b are schematic diagrams of a reference voltage divider circuit for use with the ADC of FIG. 8;

FIG. 14 is a block diagram of a 12-bit ADC which includes a second alternate embodiment of the invention.

DETAILED DESCRIPTION

Figure 1:
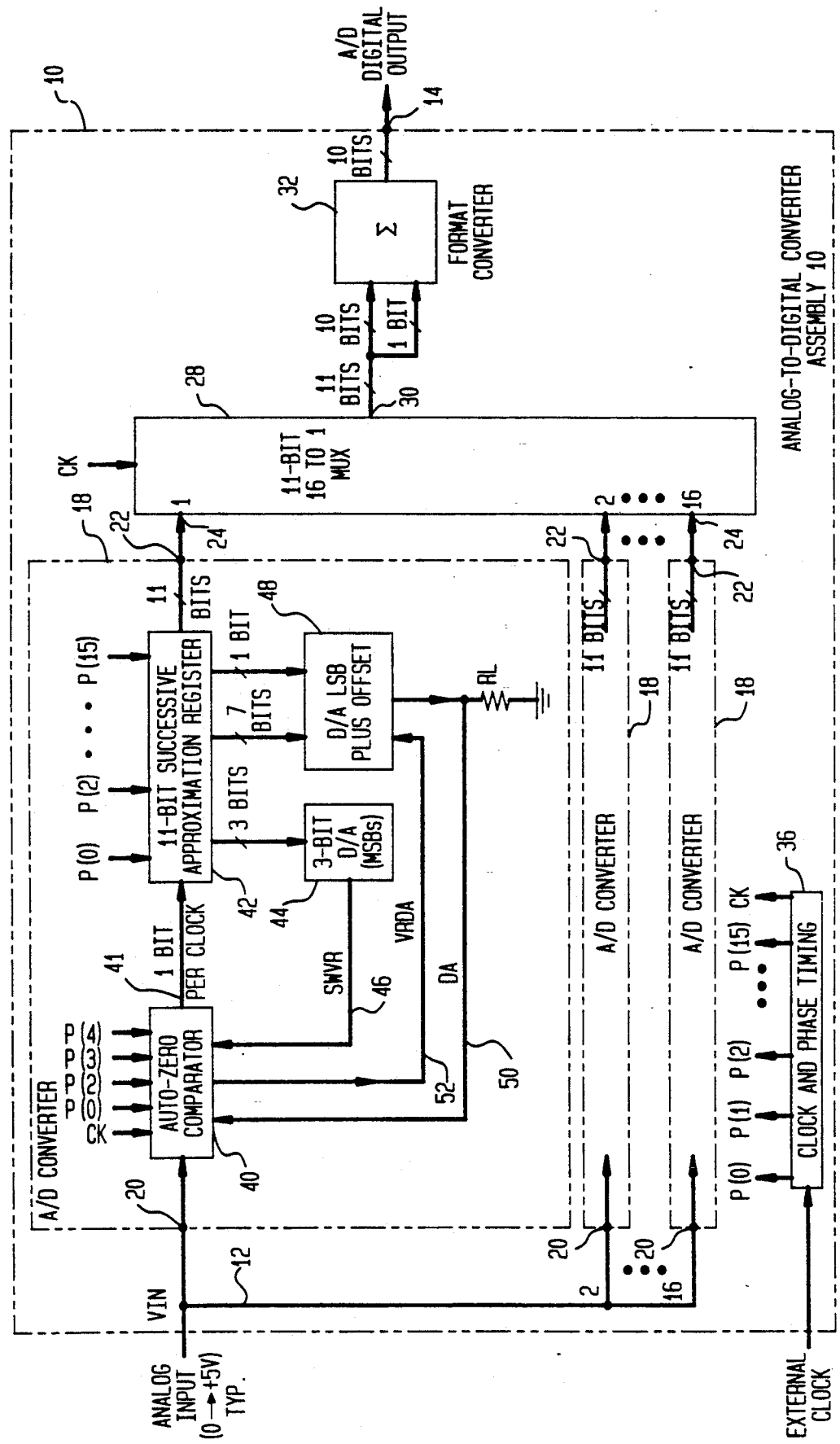
FIG. 1 is a schematic diagram of an ADC of the invention including an assembly of multiple ones of identical ADCs arranged in parallel and being driven by skewed clock and phase pulses.

In FIG. 1, an ADC assembly 10 (shown within a large dashed line rectangle) comprises an analog signal input which is connected to an input bus 12 and a digital output signal terminal 14. A high frequency signal may be applied to bus 12, and its digital equivalent, shown here as a 10-bit number, obtained in real time at terminal 14. Assembly 10 is shown comprising sixteen ADCs 18 (each being shown within a dashed line box). The first, second, third and sixteenth ADCs 18 are shown with only the first being shown in detail. Typically assembly 10 is formed on a silicon substrate using MOS technology with each ADC 18 being implemented in about 300 square mils of area. For example, there may be sixteen ADCs 18 in an assembly 10 and each ADC 18 is shown here (and subsequently) as generating an 11-bit number (N+1). Each ADC 18 has a respective voltage input terminal 20, which input terminals are connected in parallel to the bus 12 and to which are applied an analog signal input voltage VIN which is to be digitized. Each ADC 18 has an output signal terminal 22 which is connected to a respective one of input terminals 24 of a multiplexer (MUX) 28 (shown as 11-Bit 16:1 MUX) of a type well known in the art. The MUX 28 has a single output terminal 30 to which it applies in sequence the parallel 11-bit words, or digitized signals, generated by the individual ADCs 18. Connected to output 30 of the MUX 28 is an adder and format converter 32, also known in the art. Each 11-bit word from the MUX 28 is in nonstandard binary format (N+1). Format converter 32 converts each such word into a standard 10-bit N format and then applies these digital values as 10 bit words in real time to the terminal 14 of the assembly 10.

Each ADC 18 is driven by a clock and phase timing unit 36 which as shown here, generates sixteen phases P(0) to P(15) and a clock pulse CK. Each phase P is skewed by one clock pulse and there are thus sixteen phases for each complete cycle of the unit 36. Each of the ADCs 18 is driven by all of the phases P and the clock pulses CK of unit 36 but the drive of the second ADC 18 is skewed by one phase P relative to the drive of the first ADC 18, and so on, with each ADC 18 skewed in its operation by one phase relative to the prior ADC 18. Thus the sixteen ADCs 18 respectively sample the input voltage VIN at sixteen successive instants. This arrangement effectively increases the composite sampling speed of ADC assembly 10 by sixteen. It is to be understood that fewer (or more) ADCs 18 may be used depending on the sampling speed desired, and the signal processing time within each ADC 18.

Each ADC 18 comprises an auto-zero comparator 40 which, via a lead 41, sends single-bit data to a SAR 42 (shown as an 11-bit SAR). Comparator 40 momentarily samples the input voltage VIN at the terminal 20, and thereafter, in a clocked sequence in combination with the SAR 42, determines bit-by-bit the digital value of the sampled input voltage.

SAR 42 provides the three most-significant-bits MSBs of data to a DAC (shown as 3 bit MSBs DAC) 44 which in turn applies an analog switched voltage reference SWVR in a feedback loop 46 to the comparator 40. In a similar way, SAR 42 applies the seven least-significant-bits (LSBs) plus one offset compensation bit to a DAC 48 (shown as LSB DAC plus offset).

The DAC 48, which is of a type well known in the art, supplies to a load resistor RL a constant current whose analog value corresponds very accurately to the digital value of the 7 LSBs plus the one offset bit. The voltage drop across resistor RL, which may for example be 1000 ohms, is thus an analog voltage DA which is applied via a lead 50 to an input of the comparator 40. The comparator 40, in turn, via a feedback lead 52, from an auto-calibrating feedback arrangement to be described shortly, applies an automatically calibrated analog voltage reference VRDA to the DAC 48. This reference voltage VRDA automatically controls the DAC 48 so that its output current (and the voltage across resistor RL) is accurately referenced to a master voltage reference (not shown).

Each ADC 18 is connected to the master voltage reference as will be described shortly. The reference voltages SWVR, DA and VRDA, though separate, are automatically and continually referenced individually (e.g., each within a mV) against the master voltage reference (not shown) through a sequence of steps which are described below. Thus each ADC 18 is automatically made very accurate within its own cycle of operation, and the multiple operations of all of the ADCs 18 are tied together with equal, automatically obtained accuracy from the single master voltage reference, the clock pulses CK, and the phases P(0) to P(15) produced by the timing unit 36 during a cycle of operation of each ADC 18 of FIG. 1.

Each clock pulse CK is in the form of an asymmetrical square wave having a high state 60, a low state 62, and a duration 64. This duration 64 may, for example, be 20 nanoseconds (ns). A clock pulse CK goes from low to high (in voltage) at a rising leading edge 66 occurring at the beginning of a clock period 64, and from high to low at a falling trailing edge 68. The zeroth to the fifteenth clock pulse CK (sixteen identical pulses) are as indicated; thereafter a cycle of sixteen is repeated.

The clock pulses CK in turn generate the respective phases P(0) to P(15). Thus the leading edge 66 of the 0 clock pulse CK generates (slightly displaced in time) a rising leading edge 70 going from low to high of the 0 phase P(0), as indicated by a dashed arrow line 71, and the trailing edge 68 of the 0 clock pulse CK generates a falling trailing edge 72 (going from high to low) of phase P(0), as indicated by a dashed line 73. There is only one phase P(0) for the sixteen clock pulses CK in a cycle. Thereafter, another 0 phase P(0) is generated and the cycle begins again. In the same way a 1 phase P(1) is generated by the 1 clock pulse CK, as indicated by a dashed arrowed line 71a and a dashed arrowed line 73a, and so on, through phase P(15) as shown. These phases and clock pulses drive each ADC 18 as described hereinafter. By virtue of the offset compensation bit, mentioned earlier, the overall clock period 64 can be substantially reduced (e.g., by about half) without sacrificing accuracy.

Figures 3, 3A:
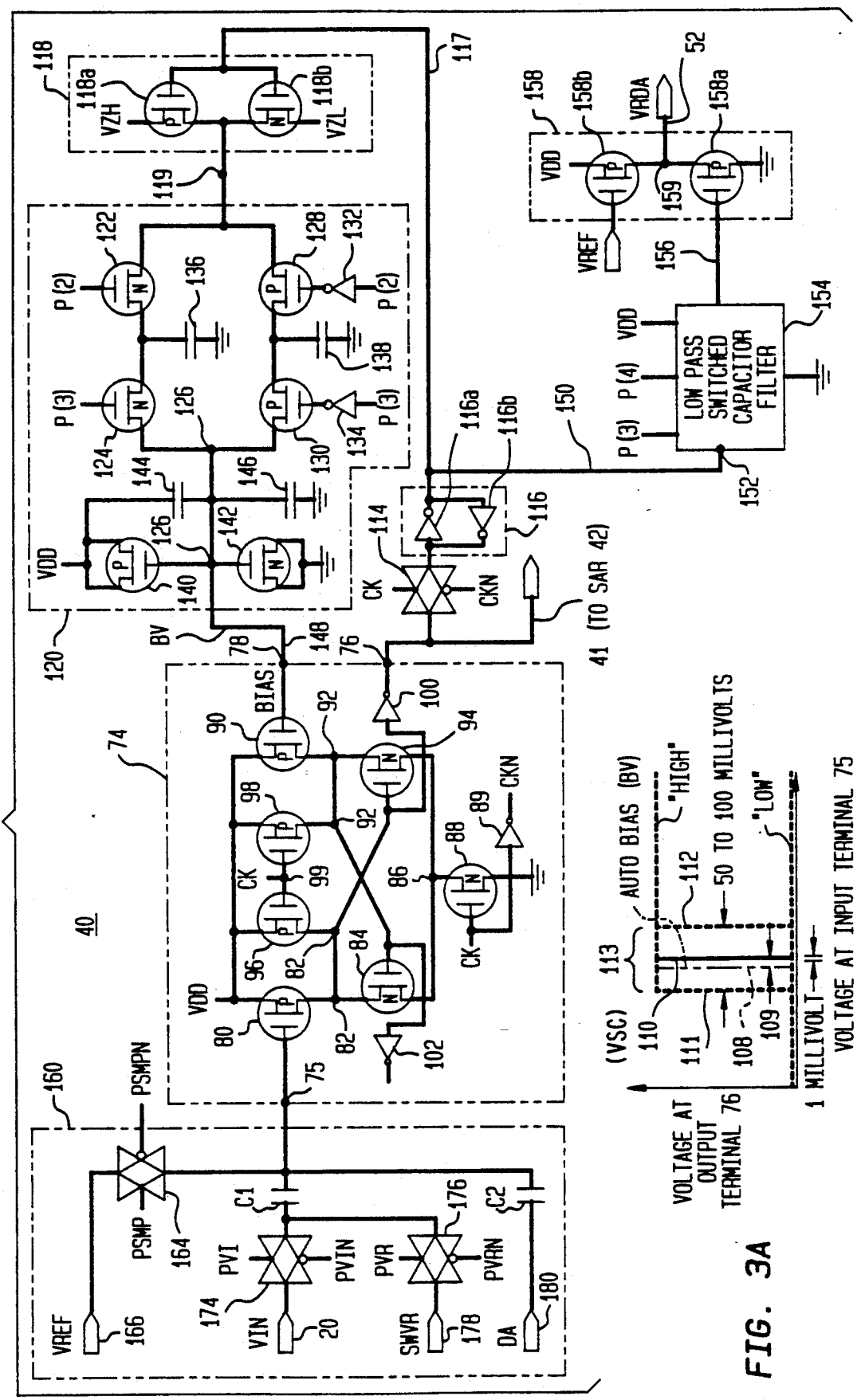
FIG. 3 is a schematic diagram of a comparator circuit (part of each one of the ADCs of FIG. 1) according to another aspect of the invention.
FIG. 3A is a voltage diagram showing the important effect of auto-bias for the comparator of FIG. 3.

In FIG. 3 a first embodiment of the auto-zero comparator 40 of FIG. 1 comprises a balanced regenerative latch 74 (shown within a dashed line box), which has a signal voltage input at an input terminal 75 and a single-digit voltage output at a terminal 76. Lead 41 is attached to this terminal 76. An analog auto-bias voltage BV is applied to the latch 74 at a terminal 78. Voltage BV automatically zeroes the switching point of the latch to a precisely controlled value.

Latch 74 comprises p-channel transistors 80, 90, 96 and 98, n-channel transistors 84, 88 and 94, and inverters 100 and 102. The sources of transistors 80, 90, 96 and 98 are coupled to a positive voltage source +VDD, and the source of transistor 88 is coupled to a reference voltage which is shown as ground. The drains of transistors 80, 84 and 96 are coupled to the gate of transistor 94, to an input of inverter 100 and to a terminal 82. The drains of transistors 90, 94 and 98 are coupled to the gate of transistor 84, to an input of inverter 102 and to a terminal 92. The sources of transistors 84 and 94 are coupled to the drain of transistor 88 and to a terminal 86.

The CK signal of FIG. 1 is coupled via a bus (not shown) to the gate of transistor 88, to input of inverter 89, and to the gates of transistors 96 and 98 and to a terminal 99. Inverter 89 generates at an output thereof an inverted CK signal which is shown as CKN. An output of inverter 100 is coupled to the output terminal 76 of latch 74. The purpose of inverter 102 is to provide a balanced capacity, mirror image of the inverter 100.

It is noted that the circuit elements of the latch 74 are symmetrical and complementary, and are arranged to give a high degree of immunity to common mode noise. By automatically adjusting ("zeroing") the bias voltage BV on the gate of transistor 90 during operation of the comparator 40 through continual reference to the master voltage reference, the value of voltage at terminal 75 which causes the regenerative latch 74 to switch its output voltage at terminal 76 to either low or high, is very accurately determined. This is automatically done by means of a feedback loop described shortly.

When the transistor 88 of the latch 74 is turned off, and transistors 96 and 98 are turned on with each clock pulse CK, terminals 82 and 92 are pulled up in potential to the supply voltage VDD. This occurs when a clock pulse CK goes from a high level 60 to a low level 62 along a falling trailing edge 68. Quickly thereafter at the rising leading edge 66 of the next clock pulse CK, transistor 88 turns on and transistors 96 and 98 turn off. At this instant, if the input voltage at the terminal 75 is even slightly above the bias voltage BV at terminal 78, the latch 74 switches the voltage at output terminal 76 to high (a value substantially equal to VDD). This is defined to be a binary 1 output of latch 74. Because of the regenerative feedback provided by the cross-coupled terminals 82 and 92, switching takes place at very high speed (e.g., in a few ns). Similarly, if the input voltage at terminal 75 is less than the bias voltage BV, the latch 74 switches the voltage on output terminal 76 to low (ground). This is defined to be a binary 0.

In one embodiment of latch 74, inverter 100 is selected to have a threshold voltage of slightly less than VDD/2. This limits voltage spikes in output terminal 76 when the output voltage at terminal 76 is to be a 0 by inhibiting a switch from a 0 to a 1 immediately after terminals 82 and 92 both drop to about VDD/2, after CK goes becomes high. Even if terminal 82 is going to stay at a high level because input terminal 75 is more negative than bias terminal 78, it may momentarily drop to VDD/2. By setting the threshold voltage of inverter 100 to slightly below VDD/2, a voltage spike towards a 1 at terminal 76 is prevented when the state thereof is going to remain at a 0.

In FIG. 3A, there is shown a voltage diagram relating the input voltage (horizontal axis) at the input terminal 75 of the latch 74 to the switched output voltage (vertical axis) at terminal 76. The auto bias voltage BV (the dashed-dotted vertical line 108) is established by an auto-bias feedback loop to be described shortly. A solid vertical line 110 shows the voltage VSC at which the latch 74 switches. The voltage VSC is established as substantially equal to a reference voltage by adjusting the value of the bias voltage BV. An offset differential voltage, indicated by 109, between bias voltage BV at line 108, and the switching voltage VSC at line 110 compensates for small differences in the characteristics of transistors in a given latch 74 and is automatically determined by the action of the auto bias feedback loop.

This offset voltage may be different from one latch 74 to another, but the switching voltage VSC is the same from latch to latch. For an input voltage at terminal 75 slightly below the switching voltage VSC, the latch 74 switches the output low, and for a value above the switching voltage VSC, the latch switches high. The sensitivity of switching is within 1 mV as shown.

In the absence of a precisely determined or set value of auto-bias voltage BV along line 108, because of slight variations in the threshold voltages of the transistors in the regenerative latch 74, the latch may have a lower switching voltage indicated by a vertical dashed line 111, or a higher switching voltage indicated by a vertical dashed line 112. This variation may be as much as 50 to 100 mV from one latch 74 to another, and would otherwise destroy the necessary accuracy in the switching voltages from one comparator 40 to another in the assembly 10 of ADCs 18.

The offset differential voltage 109 between the bias voltage BV at line 108 and the switching voltage VSC at line 110 lies within the range indicated at 113 from the lower voltage at line 111 and the higher voltage at line 112. The bias voltage BV for the latch 74 in one comparator 40 may not be exactly the same as the bias voltage BV determined separately for the latch 74 in another comparator 40 in a multiple cell ADC assembly 10. Among the reasons for this are parasitic capacitive coupling and differences in the input offset voltage for the respective latches 74 of the multiple ADCs 18 in an assembly 10. The auto-zeroing action of each comparator 40 of a given ADC 18, however, determines its own value of bias voltage BV which effectively compensates for any offset effects seen by it to give the switching accuracy and sensitivity indicated in FIG. 3A.

In FIG. 3, the output voltage from the latch 74 at output terminal 76 is connected to one side of a transmission gate 114. The gate 114 is controlled by a clock pulse CK and an inverted clock pulse CKN, the latter pulse CKN being obtained from the output of the inverter 89. The gate 114 when on, applies the voltage at the output terminal 76 to an input of a latch 116, (shown within a dashed-line box).

The latch 116 comprises a first inverter 116a and a second inverter 116b connected back-to-back. This latch 116 retains its current state after the gate 114 turns off. The latch 116 applies, via a lead 117, the voltage level it is holding to an input of a voltage inverter-limiter circuit 118 (shown within a dashed-line box and of a type well known in the art).

Circuit 118 comprises a p-channel transistor 118a whose source is connected to a voltage VZH. The drains of transistors 118a and 118b are connected to a output terminal at 119. The source of the transistor 118b is connected to a low reference voltage VZL. The gates of transistors 118a and 118b are connected to the input lead 117. When the voltage on lead 117 is high, circuit 118 applies to its output terminal 119 VZL, obtained ultimately from the master voltage reference as described below with reference to FIG. 10b, and when the voltage on lead 117 is low, the circuit 118 applies to terminal 119 a high voltage VZH similarly obtained.

By choosing the values of voltages VZL and VZH, the swing from low to high at terminal 119 is conveniently determined. For example, if the voltage on lead 117 at the input to the circuit 118 swings from 0 to +5 V (low to high), the voltage at the terminal 119 is made to swing from +3 to +2 V high to low with VZH= +3 V and VZL= +2 V. The voltage on terminal 119 is applied to a uniquely configured low pass, switched capacitor filter unit 120, (shown within the dashed-line box).

The switched capacitor filter 120 comprises n-channel transistors 122, 124 and 142, p-channel transistor 128, 130 and 140, inverters 132 and 134 and capacitors 136, 138, 144 and 146. The drain and source of transistor 140 and a first terminal of the capacitor 144 are connected to a voltage source VDD. The drain and source of transistor 142, and first terminals of the capacitors 136, 138 and 146, are coupled to ground potential. The drains of transistors 122 and 128 are coupled to the terminal 119. The source of transistor 122 is coupled to the drain of transistor 124 and to a second terminal of capacitor 136. The source of transistor 128 is coupled to the drain of transistor 130 and to a second terminal of capacitor 138. The sources of transistors 124 and 130 are coupled to second terminals of capacitors 144 and 146, to the gates of transistors 140 and 142 and to a terminal 126. Terminal 126 is coupled via a conductor 148 to terminal 78. Phase P(2) is coupled to the input of inverter 132 whose output is coupled to the gate of transistor 128. Phase P(3) is coupled to an input of inverter 134 whose output is coupled to the gate of transistor 130.

The capacitor 136 is not a separate circuit element as such, but represents the combined depletion capacity and the gate to source capacitance of transistor 122 and the gate to drain capacitance of transistor 124. The same is true for the capacitor 138 and the transistors 128 and 130. These capacitors are each very small, for example about 5 femtofarads (fF), and are substantially equal to each other. In the absence of a phase P(2) or P(3), transistors 122, 124, 128 and 130 are in effect open switches.

The capacitor 144, which is typically not a separate circuit element, represents the gate to drain-source capacitances of transistor 140. Similarly, capacitor 146 represents the same capacitances of transistor 142. Each of capacitors 144 and 146 has a value, for example, of about 2.5 picofarads, which is very much larger than either capacitor 136 or 138.

The voltage on node 126 is able to move up or down between ground and VDD, but is nominally set at around half of VDD (e.g., half of 5 V). Since transistor 122 and transistor 128 are complementary, when they are switched on by phase P(2) and P(2)N (the output of inverter 132), they substantially equally and symmetrically charge the respective capacitors 136 and 138 to the high or low voltage then at terminal 119 (e.g., voltage VZH or VZL).

Any error in charging the capacitors 136 and 138 caused by the switching off of transistors 122 and 128 is self-cancelling. For example, capacitor 136 may be left charged slightly lower than it should be, but capacitor 138 is left charged slightly higher, and vice-versa. Thereafter, when transistors 124 and 130 are turned on by phase P(3) and P(3)N (after transistors 122 and 128 are off), the charges on capacitors 136 and 138 are applied to terminal 126. The effect is to move terminal 126 slightly up or down in voltage by a very small amount because of the much larger values of capacitors 144 and 146. They are each about 500 times larger than either capacitor 136 or 138.

The voltage on terminal 126 is thus a highly filtered analog voltage which is continually being adjusted on repeated phases P(2) and P(3) in response to the digital voltage being continuously switched high or low at the terminal 119 with each clock pulse CK. After the comparator 40 has initially operated for a number of cycles (a very short time) the analog voltage at terminal 126 asymptotes to a desired value and thereafter is the auto-zeroed bias voltage BV. This voltage BV is applied via a lead 148 to the bias terminal 78 of the latch 74.

Of course, by virtue of the sequential on-off switching of the transistors 122, 128 and of transistors 124, 130 of the switched capacitor filter unit 120, the bias voltage set at terminal 126 on phase P(3) is unaffected and remains unchanged (as the desired analog bias voltage BV at input terminal 78) throughout the remaining phases P(4) to P(15) of each full cycle of operation of comparator 40.

In FIG. 3, the auto-calibration reference voltage VRDA on lead 52 is obtained as follows. Also connected to the output 76 of the regenerative latch 74 through the gate 114 and the latch 116 is a lead 150. Lead 150 is connected to an input terminal 152 of a low pass, switched capacitor filter 154. This switched capacitor filter 154 is substantially identical to the switched capacitor filter 120 previously described. The switched capacitor filter 154 has an output terminal 156 (similar to terminal 126) and the filter 154 is turned on and off in sequence by the phases P(3) and P(4) as indicated.

The voltage at output terminal 156 is an analog voltage which, as will be described shortly, is referenced by the action of the comparator 40 to the master voltage reference. The analog voltage at the terminal 156 is applied to a source/follower circuit 158 (shown within a dashed-line box) which is well known in the art. Circuit 158 comprises two p-channel transistors 158$a$ and 158$b$ whose sources and drains are connected in series between the voltage source VDD and ground as shown. The gate of the transistor 158$a$ is connected to the terminal 156 and the gate of the transistor 158$b$ is connected to the voltage VREF. The drain of transistor 158$b$ is coupled to the source of transistor 158$a$ and to a terminal 159 which is coupled to a lead 52. The voltage at terminal 159 is the analog reference voltage VRDA, which is applied via the lead 52 to the DAC 48 in FIG. 1.

In FIG. 3, terminal 75 of the latch 74 is connected to a uniquely configured interconnecting circuit 160 (shown within a dashed-line box) which comprises part of the comparator 40. The circuit 160 applies in desired sequence to the input terminal 75 of the latch 74, various input voltages, as will shortly be described. The circuit 160 comprises first, second and third transmission gates 164, 174 and 176 each having first and second control terminals and an input and output terminal, and capacitors C1 and C2. Gate 164 has signals PSMP and PSMPN (the complement of PSMP) coupled to its control terminals. Similarly, signals PVI and PVIN and PVR and PVRN are coupled to the control terminals of gates 174 and 176, respectively.

A reference voltage VREF, which is referenced to the master voltage reference, is coupled to a terminal 166 and to the input of gate 164. VREF is by way of example 2.5 V where the master voltage reference=5 V and is very accurate. VDD is also 5 V. The input of gate 174 is coupled to the terminal 20 to which an analog signal VIN is applied.

The switched reference voltage SWVR obtained via the lead 46 from the MSB DAC 44 is applied to a terminal 178 which is coupled to the input of gate 176. The analog voltage DA is coupled to a terminal 180 which is coupled to a first terminal of C2. The outputs of gates 174 and 176 are coupled to a first terminal of C1. Second terminals of C1 and C2 are coupled to the output of gate 164 and to terminal 75 of latch 74.

In FIG. 4A, a logic circuit 190 (shown within the dashed-line box) comprises a two input NOR gate 192, inverters 194, 195, 196 and 199, and a transmission gate 198. The first and second inputs of gate 192 are coupled to phase signals P(0) and P(3), respectively. An output of gate 192 is coupled to an input of inverter 194 whose output is coupled to inputs of inverter 195 and gate 198 (biased on). An output of inverter 195 is coupled to an input of inverter 196 at whose output is generated the signal PSMP. An output of gate 198 is coupled to an input of inverter 199 at whose output is generated the signal PSMPN (the complement of PSMP). Circuit 190 generates signals PSMP and PSMPN without any delay between these two output signals. This is achieved by selecting a gate 198 which has essentially the same delay time as inverter 195.

In FIG. 4B, a cross-coupled logic circuit 200 (shown within a dashed-line box) comprises a first NOR gate 202, having an upper input terminal 203 (to which P(3) is applied), and a lower input terminal 204. An output of the gate 202 is serially connected through a first inverter 206 and a second inverter 208 to a first output terminal 210 at which the signal PVR is generated. Connected to an output of the first inverter 206, via a lead 211 is a second output terminal 212 at which the signal PVRN (the complement of PVR) is generated. The circuit 200 further includes a second NOR gate 214 having a lower input terminal 215 to which P(4) is applied and an upper input terminal 216. An output of gate 214 is connected serially with a third inverter 218 and a fourth inverter 220 to a third output terminal 222. The signal PVI is generated at terminal 222. Connected to the output of the third inverter 218 via lead 223 is a fourth output terminal 224 at which the signal PVIN (the complement of PVI) is generated. The third output terminal 222 is cross-connected via lead 226 to the input terminal 204 of the gate 202. Similarly, the terminal 210 is cross-connected via a lead 228 to the terminal 216 of the gate 214.

When phase P(3) is applied to the terminal 203 of the gate 202, the connection from the terminal 210 to the terminal 216 of the gate 214 produces a signal PVI at the terminal 222. The circuit then stays latched in this condition until phase P(4). The signals PVI and PVIN are of proper polarity to turn on the switch 174 (see FIG. 3). The signals PVR and PVRN subsequently appear at the terminals 210 and 212, however, in negative polarity from that shown. As such they will not operate the transmission gate or switch 176 to which they are applied. Later, when phase P(4) is applied to the terminal 215 of the gate 214, the signals PVI and PVIN are reversed in polarity (and no longer hold on the switch 174) and signals PVR (true) and PVRN (complement) appear with proper polarity at the terminals 210 and 212. They will then turn on the switch 176. The timing of the signal PVI (and complement PVIN) relative to phases P(3) and P(4) and the signal PSMP (and complement PSMPN) of FIG. 4A is described below.

Figure 2:
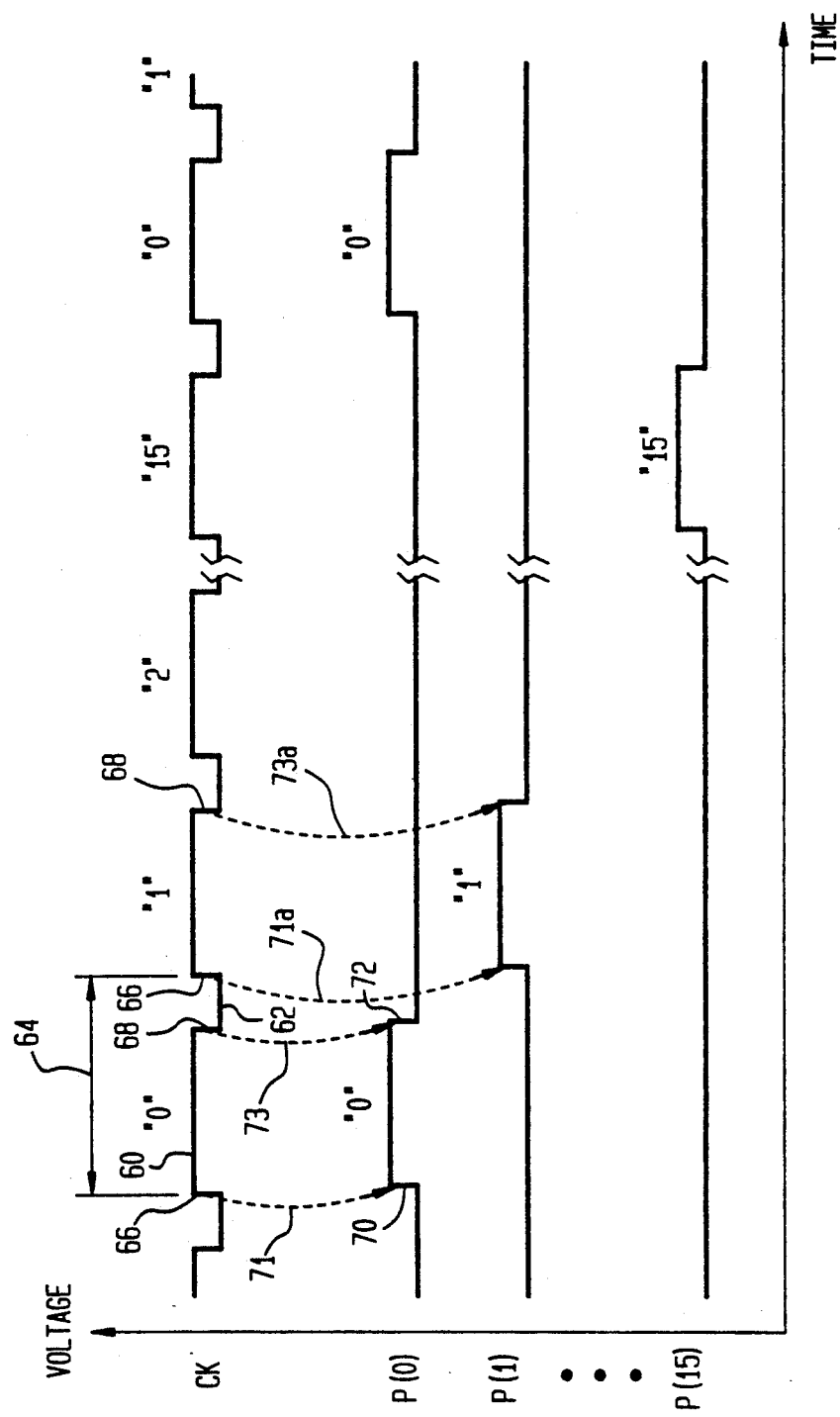
FIG. 2 is a clock and phase timing diagram of the respective phases and clock pulses used with the ADCs in FIG. 1.

In FIG. 4C, a clock pulse CK having three pulses CK2, CK3, and CK4 and signals P(3), P(4), PSMP and PVI is shown. Clock pulse CK at a rising edge 66 generates the phase signal P(3) as indicated by the dashed arrowed line 71 (see also FIG. 2).

Phase P(3) in turn generates the signal PSMP (FIG. 4A) and the signal PVI (FIG. 4B). The complements PSMPN and PVIN are not shown in FIG. 4C. When phase P(3) turns on signal PVI (as is shown by the arrowed line 230 in solid), it also turns on PSMP (as is shown by the arrowed line 231). The signal PVI, because of the cross-coupling of the circuit 200 (See FIG. 4B), remains on after P(3) turns off and until phase P(4) comes on. The turning off of signal PVI is shown in FIG. 4C by the arrowed solid line 232 from the beginning of phase P(4).

Thus the duration of PVI is longer than the duration of PSMP as indicated at 236. The signal of PSMP here is turned off by phase P(3) as indicated by the line 237. The extra time that PVI is on is essentially equal to the time that the clock pulse CK3 is at a low level 62. The importance of this extra time for PVI will be explained shortly.

In FIG. 3, the voltage at the terminal 75 (T75) is determined by C1, C2 and the voltages VREF, VIN, SWVR and DA. It is expressed by equation (1) as follows:

$$V(T75) = VREF + (SWVR - VIN) \times [C1/(C1+C2)] + DA \times [C2/(C1+C2)] \quad (1).$$

The voltage at the terminal 75 thus responds to the difference between (SWVR+DA) and VIN. The effect of small variations in exact equality of capacitors C1 and C2 is compensated for in the auto-calibration loop running from the latch 74 via the lead 52 through the DAC 48 and back via the lead 50 to the terminal 180, described previously. By automatically setting the effective gain G of the auto-calibration loop so that $G \times (C2/(C1+C2)) = C1/(C1+C2)$, the ratios of C1 and C2 given in equation (1) are made equal. Long term thermal drift of capacitors C1 and C2 is also compensated for by the auto-calibration loop. The main requirement on the capacitors C1 and C2 is therefore that they form a linear summation of the voltages SWVR and DA.

Since the voltage at the terminal 75 is that which will actually cause the latch 74 to switch low or high at a given clock count, it is desirable, among other things, that the terminal 75 remain free of secondary parasitic effects. Thus it is important that the terminal 75 be disconnected from the terminal 166 by the switch 164 slightly before the terminal 75 is disconnected from the VIN terminal 20 by the switch 174. This is achieved by the timing of signals PSMP and PVI (and their complements).

It is also desirable that the full settling time, due to the RC time constant at terminal 75, be allowed for during the auto-bias cycle which is initiated by phase P(0). Thus phase P(0) and the additional time of phase P(1) are allowed for auto-zeroing. Auto-calibration is provided for during phase P(2) and the sampling of the input voltage VIN is initiated on phase P(3).

In FIG. 5 an embodiment of the SAR 42 of FIG. 1 comprises eleven essentially identical circuits (shown within the dashed line boxes) of the positions 10 through 0, corresponding to the 10-bits of data plus one offset bit. For convenience, the positions 10 to 4 are shown on the right of the drawing, and positions 3 to 0 on the left. The position 10 corresponds to the most significant bit and position 0 to the least significant bit in the SAR 42. Position 3 corresponds to an offset bit. For convenience a table shown in FIG. 5A summarizes these bit positions and gives the corresponding outputs D(9) to D(0) as also indicated in the respective positions shown in FIG. 5.

In FIG. 5, position 10 of the SAR 42 includes a first NAND gate 250 having an output at a terminal 252 which is cross-connected to an input 253 of a second NAND gate 254, the output of which is connected, at a terminal 256, to an input of an inverter 258 whose output is D(9). Terminal 256 is connected back to a first input 260 of the gate 250. When a second input 262 of the gate 250 is driven low via a lead 264 from an output of an inverter 266 whose input is coupled to and controlled by P(4), the output of the gate 250 at the terminal 252 goes high, and the output at the terminal 256 of the gate 254 goes low. This low is coupled back to the input 260 of the gate 250 so that its output at the terminal 252 is latched high, and the terminal 256 held low.

The inverter 258 then applies a high signal to its output D(9), which is equivalent to a binary 1 at position 10 of the SAR 42. The gate 254 has a second input terminal 268 which is connected to a bus 270 (drawn vertically) which is connected to the output of an inverter 272 which is coupled by an input terminal to phase P(0) and is controlled by phase P(0). When phase P(0) occurs, the bus 270 goes low and the gate 254 is actuated so that its output at the terminal 256 goes high. This high is coupled back to the first NAND gate 250 so that its output at the terminal 252 goes low and latches the circuit in this alternate condition.

The output at D(9) is now low, equivalent to a binary 0. The gate 254 has a third input terminal 272 which is connected to the output of a NAND gate 274. A first input 275 of this gate 274 is connected to the lead 41 (drawn vertically), which lead applies the single digit output of the comparator 40 (see also FIG. 1 and FIG. 3) to the SAR 42. A second input terminal 276 of the gate 274 is connected to a lead 278 which is coupled to and actuated by phase P(5).

When input terminals 275 and 276 of NAND gate 274 are both driven high, the gate 274 pulls low the third input terminal 272 of the gate 254. This sets the terminal 256 high and the terminal 252 low leaving them in this state. Output D(9) is then low (a binary 0). If, on the other hand, the level on lead 41 had been low, representing a binary 1 from the comparator 40, the terminal 256 would have been left low on the occurrence of phase P(5), and the output at D(9) set high (a binary 1).

The terminal 256 is also connected to the gate of an n-channel transistor 280 whose source is grounded. The drain of the transistor 280 is connected to the source of a second n-channel transistor 282 whose drain is connected to a high impedance load (not shown) connected to VDD. The gate of transistor 282 is connected to a bus 284 which will be described shortly.

When the transistor 280 is disabled, the drain of the transistor 282 goes high (near VDD). When the transistor 282 and the transistor 284 are both enabled, the drain of the transistor 282 stays low (near ground). The gate of the transistor 280 is held low when the terminal 256 is low and thus the transistor 280 is held off. The drain of the second transistor 282 is pulled high to give at an output terminal MD(9) a binary 0. If on the other hand, the transistor 280 is enabled by its gate being held high, the drain of the second transistor 282 will go low when its gate, which is coupled to bus 284 and phase P(15) goes high. This signals at output MD(9), a binary 0.

It will be seen that the gate of the transistor 282 is connected to a bus 284 which is common to all of the positions 10 to 0 of the SAR 42. This bus 284 is controlled by the phase P(15) which when on outputs all of the 11 binary signals MD(9) to MD(0) then stored in the SAR 42. The signal at MD(0) of position 0 is outputted as a binary 0 only if the bus 41 goes low and holds transistor 280 in the register position 0 in an off condition. These 11 binary bits from the SAR 42 are applied in parallel to the output terminal 22 of the ADC 18 and thence to the MUX 28 as shown in FIG. 1.

These 11 binary bits, though in non-standard binary format, are an accurate digital representation of the analog signal voltage which has been sampled at the input terminal 20. They are applied by the MUX 28 to the format converter unit 32. An exemplary format converter is described below with reference to FIG. 12.

Position 9 contains identical elements to those just described in connection with position 10. Of course, position 9 is actuated by phases P(5) and P(6), as shown instead of phases P(4) and P(5) which are used to actuate position 10. For position 8 NAND gate 290 thereof has an input terminal 292 connected to the bus 270.

Thus when phase P(0) occurs and the bus 270 goes low, the output D(7) at position 8 goes high (a binary 1). An upper input terminal 294 of the NAND gate 290 is connected through an inverter 296 (identical to the other inverters such as inverter 266) to receive an inverted phase P(6) signal.

When phase P(6) occurs the output D(7) of position 8 is set to a binary 1. A NAND gate 298 of the position 8 has an input terminal 300 connected to a bus 302 which is connected through an inverter 304 to receive a phase P(2) signal as shown. When phase P(2) occurs, the output D(7) of position 8 is set to a binary 0. A NAND gate 306 of position 7 has an input terminal 307 which is connected to the bus 302. When phase P(2) occurs the output D(6) of position 7 is set to a binary 1.

Positions 6, 5 and 4 are similarly connected to the bus 302 and are set to binary 1 by phase P(2). A NAND gate 308 of position 7 has an input terminal 309 connected to a bus 310 which in turn is connected to an output of a NOR gate 312. An input terminal 314 of gate 312 is adapted to receive a phase P(0) and an input terminal 316 of gate 312 is adapted to receive a phase P(3). Thus when either phase P(0) or P(3) is applied to NOR gate 312, bus 310 goes low and sets a binary 0 in position 7. Since positions 6, 5, and 4 are similarly connected to the bus 310, they are also set to binary 0 by phases P(0) and P(3).

A NAND gate 318 of position 3 has an input terminal 320 connected through an inverter 322 to receive the inverse of the phase P(4) signal. A NAND gate 324 of position 3 has an input terminal 326 connected to the output of a NOR gate 328 which has two inputs adapted to receive phases P(0) and P(9) as shown. Thus, whenever either phase P(0) or P(9) appears, the output D(3) at position 3 is set to binary 0. When phase P(4) occurs position 3 is set to binary 1 in a way similar to the setting of a binary 1 into position 8 by phase P(0).

In FIG. 5, the setting and/or re-setting of the cross-coupled NAND gates 250 and 254 of position 10 have been described in detail. The setting and/or re-setting of the cross-coupled NAND gates in the other positions 9 to 0 of the SAR 42 occur in similar fashion. The application of the phases P(0) to P(15) (but not P(1) which is not applied here) to the various elements in the SAR 42 is as indicated.

Figure 6:
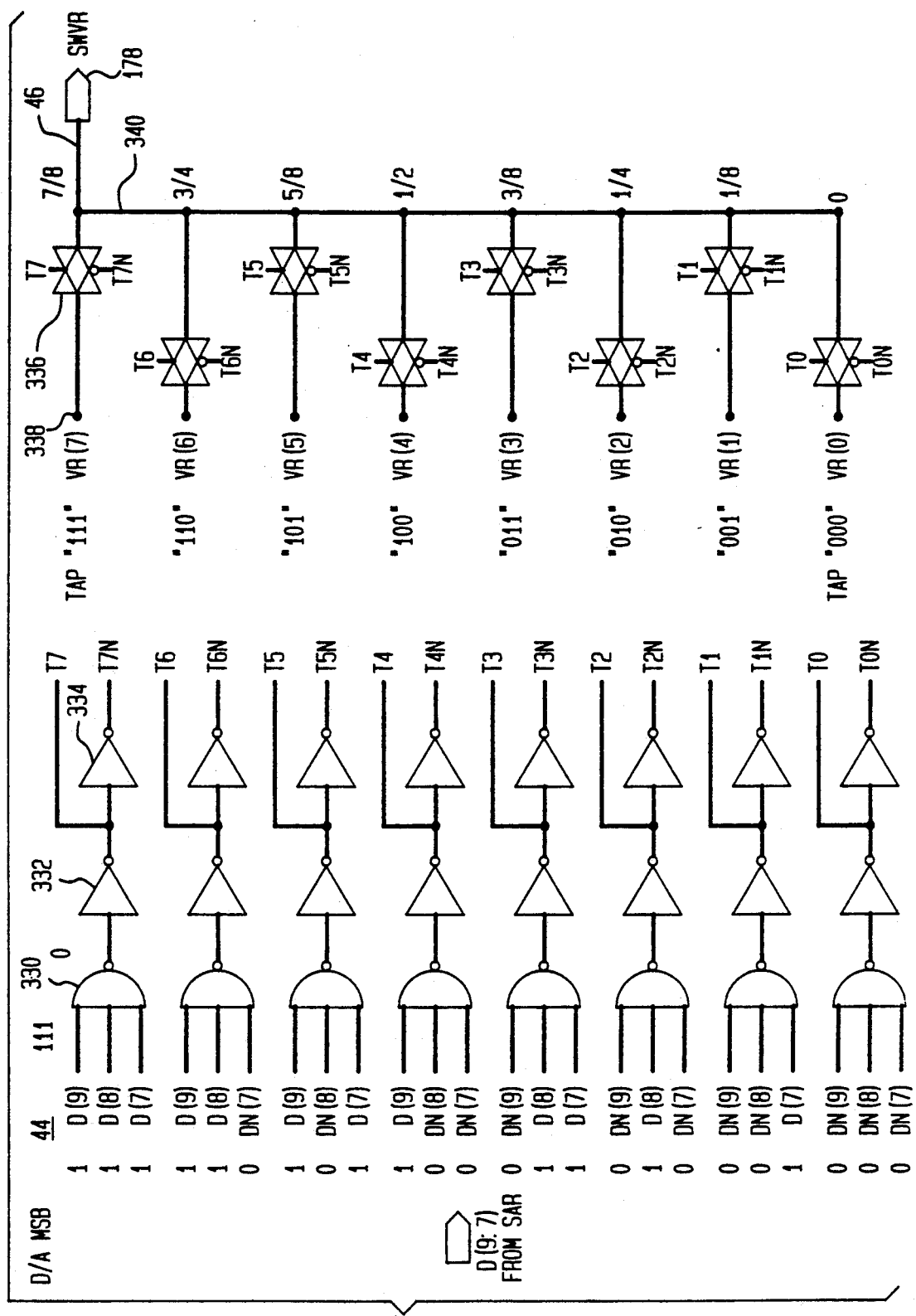
FIG. 6 is a circuit diagram showing a MSB DAC of the SAR in FIG. 5.

In FIG. 6, an embodiment of the DAC 44 shows the input binary code of the three MSBs D(9), D(8) and D(7) (see FIG. 5 and 5A) and their eight decoded equivalents. Thus for the input signal binary 111, there are obtained from the SAR 42 the outputs D(9), D(8) and D(7) which are applied here in FIG. 6 to a first NAND gate 330. The output of gate 330 is applied to a first inverter 332 to obtain at an output of inverter 332 an output signal T7. The output of the first inverter 332 is applied to an input of a second inverter 334 at the output of which is generated a signal T7N (the complement of T7).

In FIG. 6, there are also seven identical circuits corresponding respectively to the binary codes 110 through 000 of the outputs D(9), D(8) and D(7). These circuits respectively produce the signals T6 (and its complement T6N) through T0 and T0N.

Similarly, the signals T6, T6N through T0 and T0N are connected to a series of seven switches (identical to the switch 336), each of which is connected to a corresponding one of the taps VR(6) through VR(0) as shown.

The signals T7 and T7N are applied to control terminals of a first transmission gate (switch) 336. The input of gate 336, at a terminal 338, is connected to a tap VR(7) of a precision resistor voltage divider of the type described below with reference to FIG. 10a. The taps VR(7) to VR(0) are each equally separated in voltage from each other. Thus, tap VR(7) is ⅞ths of the master voltage reference, and tap VR(1), corresponding to the binary 001, is ⅛th the value.

The switch 336, and seven other switches (with no reference numbers shown) like it, are connected to a bus 340 which in turn becomes the lead 46. The lead 46 applies the switched reference voltage SWVR to the input terminal 178 of the comparator 40. By way of example, the master voltage reference may be 5V exactly, and thus tap VR(1) is ⅛th of this value. The DAC 44 thus converts the binary bits of the positions 10, 9, and 8 of the SAR 42 into their analog equivalents, represented by voltage SWVR (accurately referenced to the master voltage reference).

Similarly, the DAC 48 converts the binary bit of positions 7 to 0 of the SAR 42 into their analog equivalents as the analog voltage DA. The referencing of this voltage (auto-calibration) to the master voltage reference will now be described.

In FIG. 3, the auto-calibration loop (including switched capacitor filter unit 154, lead 52 and voltage VRDA, and lead 50 and voltage DA) has previously been described. The auto-bias voltage BV has now already been set to a desired value (phases P(0), P(1)). Positions 10, 9 and 8 of the SAR 42 (FIG. 5) are set to binary 001 so that voltage SWVR is at ⅛th (FIG. 6).

Upon initiation of the phase P(2), the four position 7, 6, 5 and 4 of the SAR 42 are set to binary 1111 (positions 3, 2, 1 and 0 are set 0000). At this point it should be noted that in a standard binary bit format, the first three positions 10, 9 and 8 of the SAR 42 represent ⅞ths of a total. That is, position 10 represents ½, position 9 represents ¼th, and position 8, ⅛th for a sum of ⅞ths. Position 7 represents 1/16th, the next, 1/32nd, and position 5, 1/64th, and so on. However, by arbitrarily assigning to position 4 a value of 1/64th (instead of 1/128th), the combined weight of binary 1 s in positions 7, 6, 5 and 4 equals exactly ⅛th. Thus the analog value (i.e., the analog voltage DA) of these four bits when set 1111 can be compared to the analog voltage SWVR when it is set to ⅛th. If there is any difference then the auto-calibrating loop (described previously) automatically eliminates the difference by adjusting the voltage VRDA and hence the voltage DA. The positions 7, 6, 5, and 4 of the SAR 42 are set 1111 on phase P(2), and position 8 reset to 0 at this time, and positions 10, 9, 3, 2, 1, 0 are already set to binary 0.

In FIG. 3, the input voltage VREF at input terminal 166 was applied at phase P(0) to terminal 75 by turning on the switch 164 as previously described (FIG. 4A). This charges the capacitor C2 to the difference in voltage between VREF and the voltage DA at terminal 180 (which on phase P(0) was set to zero). The capacitor C1 was charged to the difference between the voltage VREF and the voltage SWVR, the switch 176 being on at this time. The voltage SWVR is set to ⅛th during phase P(0). Later, on phase P(2), when the voltage SWVR is set to zero and the voltage DA set to ⅛th, since capacitors C1 and C2 are effectively equal the voltage on the terminal 75 does not change (assuming the voltage DA is exactly equal to ⅛th). This voltage DA (for a bit value 11110000 applied to the DAC 48) will have previously asymptoted, through the action of the auto-calibrating loop, to ⅛th of the master voltage reference (in a manner identical to the asymptoting of the bias voltage BV during auto-biasing). Any small difference between SWVR and DA is detected and voltage DA adjusted accordingly by the action of the auto-calibrating loop. Thus the analog voltage DA is accurately referenced (against voltage SWVR) to the master voltage reference.

The extra weight assigned to the bit of position 4 of the register is equal to 1/128th (half of 1/64th). This extra weight is used as offset compensation to enable the comparator to operate at much higher speed. Because the time required for the charging to a voltage by a resistance-capacitance RC network is determined by the RC time constant, the voltage on terminal 75 does not instantly change to the charging voltage. There is a delay called settling time, and it is related to the RC time constant and the voltage change. By initially adding a small offset voltage into the analog voltage DA at terminal 180, during the cycles that the higher values of the MSBs (and the next several LSBs) are being determined, comparator 40 can operate accurately at a rate faster than the settling time would otherwise permit. That is, the comparator, by virtue of this small compensating voltage (temporarily added to analog voltage DA), can make an accurate determination of these higher value bits at much higher speed (e.g. twice as fast) than would be possible if the comparator were delayed in its sampling by the full amount of the settling time. As the voltage change at terminal 75, see equation (1), becomes smaller and smaller, meaning that more and more bits have been determined by the SAR 42, the settling time decreases. At a suitable point in the operation of the SAR 42 the offset compensating voltage is removed, and the comparator 40 still operate accurately at the high speed it is being clocked at.

When the comparator 40 is sampling the terminal 75 sooner than the settling time would otherwise permit, the comparator (without the offset) may make an error (settling time error) either high or low. For example, if the input voltage at the terminal is greater than the binary value ½, but the comparator errs so that ½ is not included in the partial sum of the binary digits, then the maximum binary value of the remaining digits in the partial sum will always be less than ½. On the other hand, if the input voltage is less than the value ½, but the comparator errs so that ½ is included in the partial sum, then there is no way to reduce the partial sum using lower order bit values.

Settling time errors are avoided by choosing an appropriate value of offset voltage VO. The value of VO is relatively small (e.g., 1/64th in weighted value), but is large enough so that in determining the higher order bits (where the voltage changes on the terminal 75 may be relatively large and hence settling times longer) settling time is compensated for by adding a voltage VO/2 to the analog voltage DA, the weighted value for the bits contributing to the partial sum in SAR 42 converges to VIN-VO/2.

After determining the partial sum for bits which are weighted with values greater than VO, the VO/2 offset on analog voltage DA is removed, and an extra clock cycle (in position 4) is provided. This extra cycle enables the comparator 40 to determine whether the weighted value of the offset voltage VO should be added to the partial sum in the SAR 42 or left out. Using this correction algorithm the comparator 40 may have an initial error as great as +/−VO/2. For example, if the comparator error is −VO/2 then the initial partial sum (before the VO/2 offset is removed) will converge toward VIN−VO/2−VO/2=VIN−VO and the extra VO cycle will provide the +VO compensation required. Similarly, if the comparator error is initially as high as +VO/2 then the initial partial sum converges to VIN−VO/2+VO/2=VIN so nothing will be added during the extra VO cycle. The remaining lower order bits of the partial sum from position 3 (VO/2) to position 0 are then determined in order to obtain the N+1 bit value of VIN.

In the SAR 42, the voltage VO has a binary weight represented by position 4 (1/64th), and VO/2 has the binary weight of position 3 (1/128th). A bit at position 4 is either added or not at phase P(10) following the correction algorithm as described previously. Thereafter, because settling time is no longer a concern, as explained above, the comparator 40 continues on its regular clock cycle in determining the remaining bits without any offset (no longer needed).

In FIG. 3, all of the bits of the SAR 42 are set to binary 0 when phase P(3) begins. The comparator 40 will have previously set the bias voltage BV, and the analog voltage DA (with offset) to desired values as previously described. Phase P(3) initiates the sampling of VIN by referencing it to VREF, SWVR and DA at the terminal 75 (see equation 1). The switches 164, 174, and 176 are turned on and off at phase P(3) as previously explained (see FIGS. 4A, 4B, and 4C). Then the comparator 40, at the beginning of clock pulse CK4, determines whether the voltage is higher or lower than the auto-zero switching voltage VSC. If lower, indicating a binary 1 for the first bit, corresponding to position 10 of the SAR 42, lead 41 goes low. Phase P(4) unconditionally sets position 10 to a binary 1. If lead 41 is low when phase P(5) occurs, position 10 remains at a binary 1. However if lead 41 is high (indicating that the first bit in the SAR 42 should be a binary 0), phase P(5) and the high on lead 41 re-set position 10 to a binary 0. This procedure is then repeated phase after phase until all of the bits in the register are set. It should be noted that on phase P(14) position 0 is set to a 1 and on phase P(15) this bit is read either as a 1 or a 0 depending on whether lead 41 is low or high at that time.

In FIG. 7, there is shown in summary table form the sequence of setting and re-setting of the bits in the SAR 42 phase by phase. After a complete cycle of the sixteen phases P has been completed, another cycle is begun. Looking at the location in the table corresponding to position 10 and phase P(4), the symbol 1/S shown indicates that the bit at this position 10 is conditionally set to a 1, and then on the following phase P(5) set (S) to its final value (either a 1 or 0).

At phase P(9) the offset compensating voltage on the analog voltage DA is removed by re-setting the 1 bit which had been present in the position 3 to a 0. Then, on phase P(10), the offset compensating bit (representing V0) at position 4 is set to a 1 and on phase P(11) is set (S). On phase P(11) the bit at position 3 (representing V0/2) is set to 1 and on phase P(12) is set (S) to its final value. At phase P(15) all of the set (S) bits in the 11 positions of the SAR 42 are outputted, as explained previously.

Figure 8:
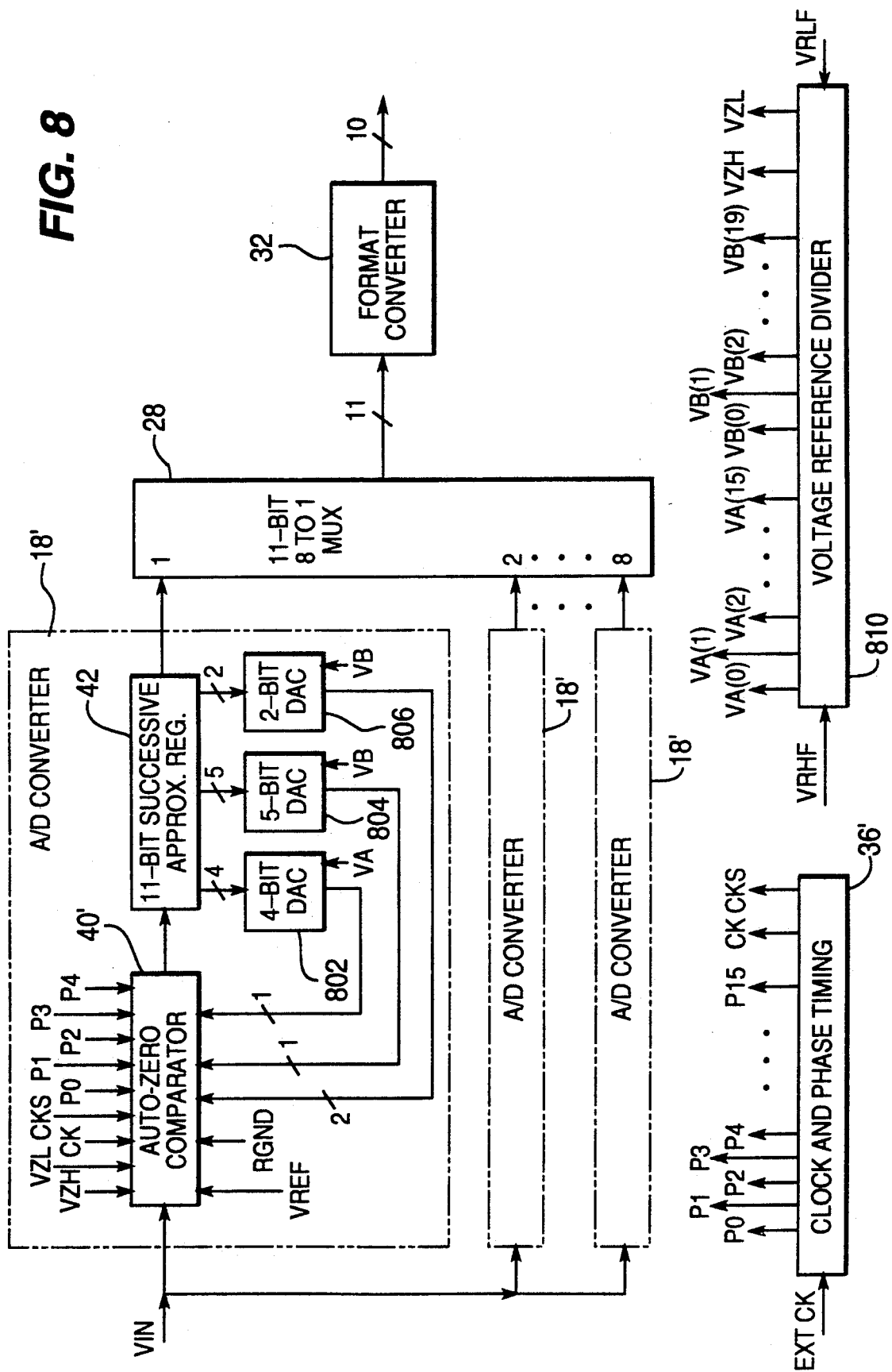
FIG. 8 is a block diagram of a 10-bit ADC which includes a first alternate embodiment of the invention.

In FIG. 8, the assembly 10 differs from the embodiment of FIGS. 1–7, in the structure and operation of the auto-zero comparator 40' and of the DACs 802, 804 and 806. The embodiment of FIG. 8 uses only eight ADC stages 18' instead of sixteen and employs a novel voltage reference divider circuit 810. The eight ADC stages are implemented using 16 clock phases by offsetting the clock phases applied to successive ones of the ADCs 18' by two. For example, clock phase P2 applied to the second ADC 18' shown in FIG. 8 has the same effect as clock phase P0 applied to the uppermost ADC 18'. Using this scheme, only eight input samples are taken, one for each of the eight ADCs 18', during any sixteen pulses of the clock signal CK.

All of the DACs 802, 804 and 806 are of the switched voltage source type which uses significantly less power than the voltage controlled current source which is used as the DAC 48 of FIG. 1.

In this embodiment, the modified ADC 18' includes an auto-zero comparator 40' which receives the input analog signal VIN and four analog signals generated by three DACs 802, 804 and 806. This comparator 40' does not generate an analog reference voltage VRDA as in the previously described embodiment. Accordingly, the ADCs 18' employ a different auto-calibration mechanism.

Figure 9:
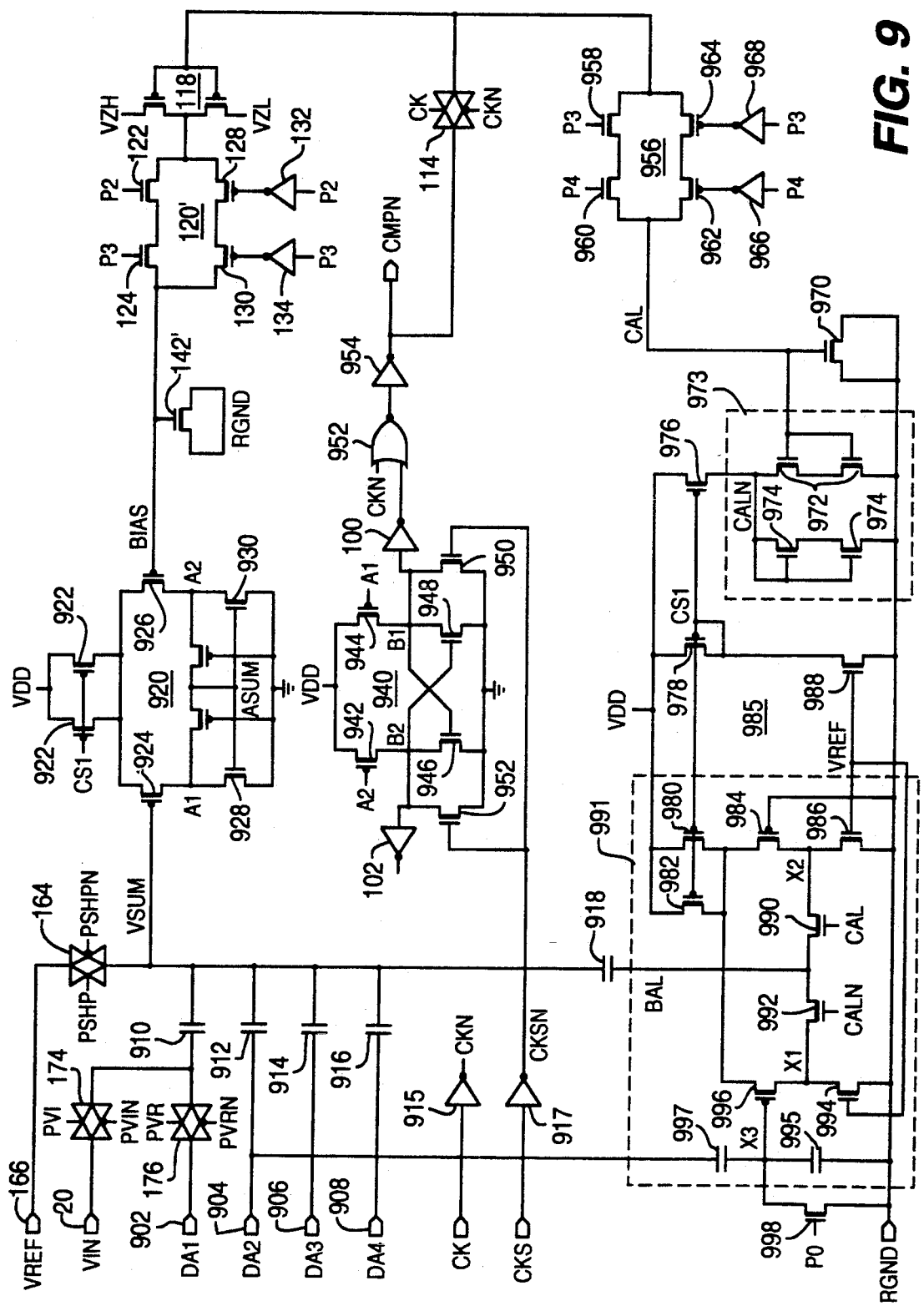
FIG. 9 is a schematic diagram of an auto-zero comparator for use in the ADC of FIG. 8.

FIG. 9 is a schematic diagram, partly in logic diagram form, of an auto-zero comparator suitable for use as the comparator 40' of FIG. 8. In comparing FIG. 9 to FIG. 3, a differential preamplifier 920 has been added as an input stage to a regenerative latch 940. Together, these components replace the latch 74 of FIG. 3. In addition, the comparator shown in FIG. 9 includes a gain adjust circuit 985 which has no counterpart in the comparator of FIG. 3. A signal CPMN, which is inverted but otherwise equivalent to the signal CPMRST generated by the latch 74 is provided by gating the output signal provided by the latch 940 with the clock signal CKN in a NOR gate 952.

In normal operation, after the calibration steps performed in phases P(0) through P(4) as described above, the input signal VIN is sampled onto capacitor 910 by turning on both of the transmission gates 164 and 174. Other input signals to the summing junction VSUM are analog potentials, DA2, DA3, DA4, provided by the DACs 804 and 806 and the balancing potential BAL applied by the gain adjust circuit 985, via the capacitor 918. These other input potentials are fixed at their nominal low levels while VIN is sampled. In this configuration, the left side of capacitor 910 is charged to VIN and the right side of capacitor 910 is charged to VREF. Transmission gate 164 is then turned off. This may change the voltage on VSUM by a small residual offset value due to an imbalance in the capacitively coupled clock component from the negative-going transition of PSMP and the positive-going transition of PSMPN.

Next, gate 174 is turned off, disconnecting the capacitor 910 from the input signal VIN, and gate 176 is turned on, connecting the left side of the capacitor 910 to the analog potential DA1 provided by the DAC 802. After a defined settling time, the voltage at node VSUM is determined in accordance with the equation (2).

$$VSUM = VREF + (DA1-VIN)*(C910/CT) \\ + DA2*(C912/CT) + DA3*(C914/CT) \\ + DA4*(C916/CT) + BAL*(C918/CT) \quad (2)$$

where BAL is the potential developed at the output of the gain adjust circuit 985, described below, C910 is the capacitance of capacitor 910, etc., and CT is the total capacitance on node VSUM as defined by equation (3).

$$CT = C910 + C912 + C914 + C916 + C918 + Cpsum \quad (3)$$

where Cpsum is the parasitic capacitance on node VSUM.

Note that the voltage at node VSUM corresponds to the difference between the input signal VIN on one hand and the sum of the potentials provided by the DACs 802, 804 and 806 on the other hand. The capacitors are scaled to sum the charges provided by the DACs 802, 804 and 806 in proper proportions. In the exemplary embodiment, the capacitors 910 through 918 have values as shown in Table 1, assuming a unit capacitance value of C.

TABLE 1

| Capacitor | Value |
|-----------|-------|
| 910 | 4C |
| 912 | 2C |
| 914 | C |
| 916 | C |
| 918 | C |

In this embodiment, C is 25 femtofarads (fF). Variations in the exact capacitance ratio of capacitor 910 to capacitor 912, which is nominally 2, are compensated in the autocalibration loop by the gain adjust circuit. In addition, this circuit compensates for inconsistencies between the two reference voltage divider networks (shown in FIG. 10a) which are used by the DACs 802 and 804.

In the exemplary embodiment, all capacitors are made using deposited inter-level dielectric films. As is well known, capacitors made in this manner may be typically matched to better than 1% over small layout dimensions (approximately 120 μm by 120 μm). Capacitances can be effectively multiplied by using parallel combinations of matched capacitors. I have determined that, using these techniques, the relative values of the capacitors used in each of the auto-zeroed comparators 40' may be controlled to achieve an accuracy of better than ±0.25 LSB for the 10-bit ADC.

In this embodiment, the auto-zero control loop adjusts a bias voltage applied to a differential preamplifier 920 which, in turn, develops output signals A1 and A2 that are applied as the input signals to the regenerative latch 940. The auto-zero control loop includes a gate 114 which applies the output signal, CMPN, of the latch 940, to the CMOS inverter 118. The inverter 118 is coupled to provide its output signal to a switched capacitor filter 120' which is substantially the same as the switched capacitor filter 120 described above. For the sake of simplicity, the pseudo capacitors 136 and 138 are not shown in the switched capacitor filter 120'. In addition, the transistor 140 and capacitor 144 and capacitor 146 of the switched capacitor filter 120, shown in FIG. 3 have been eliminated from the switched capacitor filter 120' of FIG. 9.

Another difference between the switched capacitor filter 120' and the switched capacitor filter 120 of FIG. 3 is the reference potential used to define the output signal. In FIG. 3, this reference potential is ground. In FIG. 9, this reference potential is a reference ground RGND. The potential RGND is the reference ground potential which serves as a reference for the input signal VIN. To mitigate the effects of noise propagated through the substrate, this reference ground connection is fully diode-isolated from the substrate.

The preamplifier 920 amplifies the difference between the signal existing at node VSUM and the bias potential applied by the switched capacitor filter circuit 120' by a factor of approximately five. The inventor has determined that, with this preamplifier stage, the sensitivity of the exemplary ADC stages 18' is increased to better than 0.2 millivolts (mV).

The preamplifier is implemented with a differential PMOS input stage (transistors 924 and 926) which is loaded by a pair of NMOS current sources (transistors 928 and 930) and a common mode DC feedback circuit (transistors 932 and 934). The feedback circuit averages the potentials A1 and A2 at the drain electrodes of the transistors 924 and 926, and applies the averaged potential ASUM to the gates of the current source transistors 928 and 930. The feedback potential ASUM sets the DC bias level on A1 and A2 such that the sum of the currents passed by transistors 928 and 930 is equal to the current provided by the PMOS current mirror output transistors 922.

The amount of current provided by these transistors is determined by the input leg of the current mirror circuit which includes transistors 988 and 978 of the gain adjust circuit 985. Transistor 988 draws a set current based on the difference between its gate potential VREF and its source potential, RGND. This current is also drawn through transistor 978 responsive to the difference between its gate potential CS1 and its source potential VDD. It is this gate potential which is applied to the transistors 922 of the preamplifier 920. Since the device geometry of the transistors 922 is the same as that of transistor 978, the current flowing through each of the transistors 922 is substantially the same as that which flows through transistor 978. Consequently, the DC bias point for the nodes A1 and A2 is controlled to a value very close to the reference potential VREF.

In addition, the ON resistance of the transistors 932 and 934 serves as a load for the differential input transistors 924 and 926. This load resistance lowers the voltage gain and output impedance of the preamplifier 920, thereby reducing the time constant of the preamplifier and improving its transient response. Due to the differential (i.e. antiphasal) nature of the signal voltages at nodes A1 and A2, the average potential ASUM has only a small signal component. The output signals A1 and A2 of the preamplifier are applied to the regenerative latch 940 as indicated.

Alternatively, another preamplifier stage (not shown), identical to the preamplifier 920 may be coupled between the output terminals A1 and A2 of the preamplifier 920 and the input terminals of the latch 940. Using the terminology of the preamplifier 920, the terminal of the new preamplifier which corresponds to the VSUM terminal of the preamplifier 920 would be connected to the A2 output terminal of the preamplifier 920 and the terminal corresponding to the BIAS input terminal of the preamplifier 920 would be connected to the A1 output terminal of the preamplifier 920. The connections between this new amplifier and the latch 940 would be the same as for the preamplifier 920.

The latch 940 operates in substantially the same way as the latch 74 in FIG. 3. The principal difference between these two circuits is that the latch 74 is reset by the signal CK applied to the gate electrodes of PMOS transistors 96 and 99 while the latch circuit 940 is reset by the signal CKN applied to the gate electrodes of NMOS transistors 950 and 952. One skilled in the art would recognize these as equivalent circuits.

It is noted that the regenerative latch 940 is enabled by a transition from high to low of the signal CKSN, an inverted version of the sampling clock signal CKS provided by an inverter 917. As described below with reference to FIG. 11, this transition of CKSN leads the corresponding transition of CKN by approximately 2 ns. This lead time allows the regenerative latch 940 to stabilize in one of two possible logic states before the signals A1 and A2 change due to switching transients which are developed synchronous with the digital clock signals CK and CKN.

The gain adjust circuit 985 provides a highly linear variable attenuation of the signal voltage at node X3 which is coupled to signal DA2. In the exemplary embodiment, this attenuation is applied over an input signal range of 0 to 250 mV. The gain of the circuit 985 is adjustable from +0.2 to −0.2. The DC offset of the output signal BAL provided by the circuit 985 is not critical since, in this application, the signal BAL is capacitively coupled to the node VSUM. The circuit 985 has, however, been designed to provide good common mode rejection for variations in VDD and VREF.

The circuit 985 includes a switched capacitor filter 956 which includes NMOS transistors 958, 960 and 970, PMOS transistors 962 and 964 and inverters 966 and 968. This filter is substantially identical to the switched capacitor filter 120' described above except that it operates on clock phases P3 and P4 while the circuit 120' operates on phases P2 and P3. The low pass filter 956 generates a DC control voltage CAL at the gate electrode of transistor 970 which is applied to a unity-gain inverting amplifier 973 formed by the transistors 972, 974 and 976. This amplifier produces a control voltage CALN which is the inverse of the control voltage CAL.

The final component of the circuit 985 is a linear differential attenuator 991 formed by transistors 980, 982, 984, 986, 990, 992, 994, 996 and 998 and by capacitors 995 and 997. This attenuator sums portions of inverted and non-inverted signals derived from the signal DA2, the output signal of the DAC 804, based on the control voltages CAL and CALN to generate the control potential BAL.

The switching threshold of the unity-gain amplifier 973 is set close to VREF as described below. The drain current, Iref, of NMOS transistor 988 on the input leg of the current mirror, is mirrored by the PMOS transistors 978 and 976 so that the drain current of transistor 976 is also Iref. The sizes of the transistors 972 and 974 are matched to transistors 988. Consequently, when the control potential CAL equals VREF, the drain currents of the transistors 974 and 972 are equal to Iref/2. This forces the inverse control potential CALN to be VREF.

The linear differential attenuator 991 is controlled by the signals CAL and CALN. Transistors 984 and 996 form a PMOS differential pair that divides current provided by transistors 980 and 982 which are on the output legs of the current mirror. The input leg of the current mirror is the transistor 978, as described above. If the drain current of transistor 978 is Iref, then the current supplied to the differential pair 984 and 996 is 2Iref.

Since the gate electrode of transistor 984 is coupled to RGND, the differential amplifier is balanced when the potential across capacitor 995 is equal to 0 V. In this instance the drain current flowing in both transistors 984 and 996 is Iref. Transistors 992 and 990 have relatively low impedances and operate as resistors in the linear portion of their respective output characteristics with a relatively small drain to source voltage drop Vds. The signal at node X1 is antiphasal to the signal X3 across capacitor 995 while the signal at node X2 is in phase with the signal X3.

The output signal BAL of the gain adjust circuit 985 is a linear summation of the potentials at nodes A1 and A2 which, depending on the resistance ratio of MN2 and MN3 (proportional to the ratio of CAL and CALN), may be phase with or out of phase with the signal X3. This circuit provides an adjustment range in gain from about −0.02 to +0.02 in the DAC 18' shown in FIG. 8. This is sufficient to compensate for expected variations in capacitance ratios and for expected inconsistencies between the two reference voltage divider circuits 1010 and 1012 described below with reference to FIG. 10a.

The input signal, X3, to the gain-adjust circuit 985 is provided by a capacitive voltage divider circuit formed by the capacitors 995 and 997. In terms of Table 1, above, the capacitors 995 and 997 each have a capacitance of C. The AC signal X3 across capacitor 995 changes in proportion to changes in the AC component of the signal DA2 provided by the DAC 804. It is this signal which is attenuated and then added back to the signal at the summing junction VSUM to compensate for variations in capacitor ratios or in the resistor divider networks. To clear any DC component that may develop during the processing of a previous sample, the potential X3 across the capacitor 995 is set to zero by turning ON transistor 998 coincident with the clock phase PO.

Alternatively, the capacitors 995 and 997 and the transistor 998 may be eliminated and the output signal DA2 of the DAC 804 may be directly connected (not shown) to the gate electrode of the transistor 996.

In FIG. 10a two voltage divider networks 1010 and 1012 are used by the DACs 802, 804 and 806 to generate the analog potentials DA1, DA2, DA3 and DA4. The voltage divider network 1010 is implemented as a dual ladder network having pairs of cross-connected resistors in series. For simplicity, the connections between each pair of resistors are not shown; the cross-connected nature of the resistors and the parallel connection of the two ladder networks is shown in FIG. 10a by the common signal names used for the two resistor networks. Resistors in each of the networks that are connected to the same signals are implemented at complementary positions on the two resistor ladders. For example, consider the two resistors R12 and R12' which are connected between signals VA(1) and VA(2). These resistors are connected in parallel as shown by their connections to the signals VA(1) and VA(2) but are implemented on the die at opposite ends of their respective resistor chains. This structure cancels first order gradients in the N+ layer in which the resistors are implemented.

To obtain a highly accurate resistor divider, the resistors should be implemented in a heavily doped material, such as N+ polysilicon and placed on a thick dielectric glass to reduce bottom surface depletion. Additionally, if an N-well resistor is placed under the reference resistor and driven with the same voltage at its ends, then the local normal electric field on the bottom of the reference resistor will be constant. This substantially eliminates modulation of the resistivity by signals conveyed through the substrate. In addition, it is contemplated that the layout of the resistor network may have more resistors in parallel (not shown) which are cross-coupled in this manner to cancel first-order resistivity gradients in both the X and Y directions.

In FIG. 10b a third resistor network is used to generate the voltages VZH, VZL and VREF. The voltages VZH and VZL are used by the inverter 118 of FIG. 9 to limit the positive and negative swing of the signal applied to the switched capacitor filter 120'. The reference voltage VREF is used at various locations throughout the auto-zeroed comparators 40' of each of the ADCs 18' as indicated in FIG. 9.

Exemplary values for the resistors shown in FIGS. 10a and 10b are shown in Table 2. Each of the capacitors shown in FIGS. 10a and 10b is a parasitic capacitance formed between the resistor and the substrate. In the exemplary embodiment, each of these capacitors has a capacitance of approximately 0.5 picofarad (pF).

TABLE 2

| Resistor | Value |
|---|---|
| 1014 | 12Ω |
| 1016 | 96Ω |
| 1018 | 6Ω |
| 1020 | 546Ω |
| 1022 | 780Ω |
| 1024 | 800Ω |
| 1026 | 200Ω |

Figure 11:
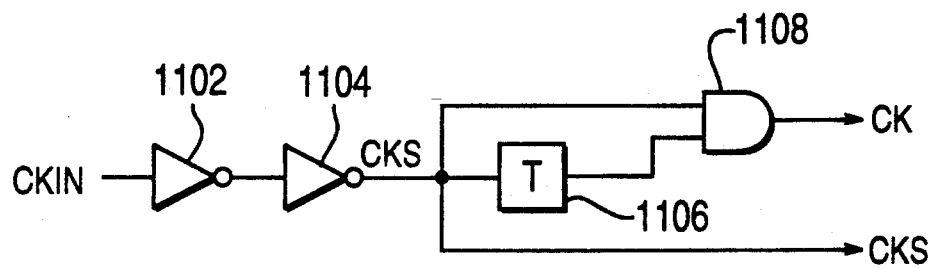
FIG. 11 is a logic diagram, partly in block diagram form, of clock signal generation circuitry suitable for use in the ADC of FIG. 8.

FIG. 11 is a block diagram of the circuitry which generates the signals CK and CKS from an input clock signal CKIN applied to the ADC via an external input terminal. In this circuit, the input signal CKIN is applied to two serially connected inverters 1102 and 1104.

These inverters shape the pulse so that the output signal, CKS is suitable for use as a clock signal in each of the component ADCs 18'. The signal CKS is applied directly to one input terminal of an AND gate 1108 and through a delay element 1106 to a second input of the gate 1108. The signal CK provided by the gate 1108 has a positive-going transition which is delayed, with respect to the signal CKS, by the propagation delay through the delay element 1106 (e.g. 2 ns) and has a negative-going transition which is delayed only slightly (i.e. only by the propagation delay through the gate 1108) from the negative going transition of the signal CKS. As set forth above, the rising edge of signal CKS is used to latch the auto-zero comparator 40' so that it is in a known state before the digital clock signal CK occurs.

Figure 12:
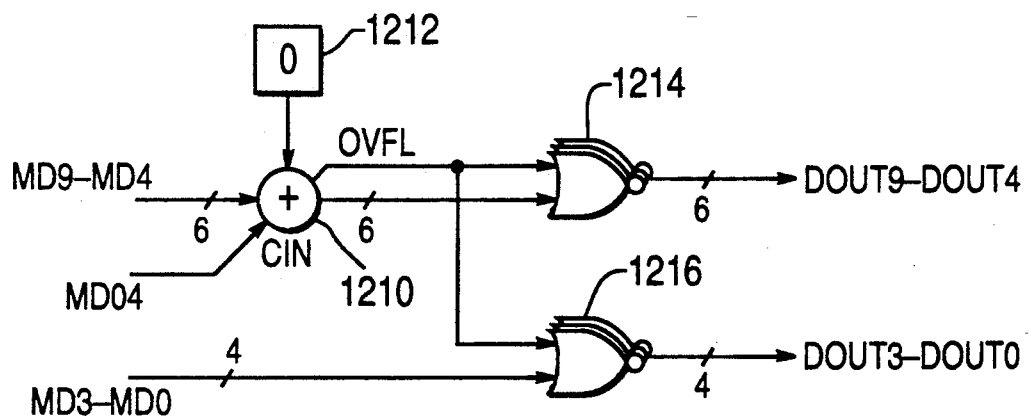
FIG. 12 is a logic diagram, partly in block diagram form of format conversion circuitry for use in the ADC of FIGS. 1 and 8.

FIG. 12 is a logic diagram of a format converter suitable for use in the ADCs shown in FIGS. 1 and 8. It is described below with reference to signals generated by the SAR 42'. In this circuit, the output signals MD4 through MD9 of the SAR 42' are applied to one input port of a six-bit adder 1210 while a zero-valued signal is applied to the other input port. The signal MD04, which is used as described above as an offset to reduce the settling time of the input circuitry, is applied to the carry-in CIN input terminal of the adder. The individual bits of the output value of the adder 1210 are applied to first input terminals of respectively different NOR gates 1214. The second input terminals of these gates are coupled to receive the overflow output signal CVFL of the adder 1210. The signal OVFL is also coupled to the second input terminals of four NOR gates 1216, the first input terminals of which are coupled to receive the output signals MD0 through MD3 of the SAR 42'. The output signals of the NOR gates are inverted versions of the output signals DOUT0 through DOUT9 of the ADC.

In FIG. 12, the offset signal MD04 is only a factor in the value of the digital output when it has a value of one. In this instance it is added to bits 4 through 9 of the output value as a carried term from bit position 3. Bits 0 through 3 of the digital output signal are not affected by the offset signal MD04.

FIG. 3a is a logic diagram of the DAC 802 which generates the analog signal DA1 from the digital values held in the SAR 42. As described above, this analog signal is applied to the auto-zero comparator 40'. The circuitry shown in FIG. 13a includes 16 transmission gates, 1302 through 1332. Each of these gates is driven by a respectively different pair of complementary control signals MT(0), MTN(0) through MT(15), MTN(15). These control signals correspond to various combinations of the output signals, D(6) through D(9) of the SAR 42. The truth-table description of the logic function which generates the control signals is shown in Table 3. For the sake of simplicity only the signals MT(0) through MT(15) are shown in Table 3. The complementary signals MTN(0) through MTN(15) may be obtained by inverting the respective signals MT(0) through MT(15).

One of ordinary skill in the art can readily design suitable circuitry to implement the logic function represented by Table 3.

TABLE 3

| D9 | D8 | D7 | D6 | MT 15 | MT 14 | MT 13 | MT 12 | MT 11 | MT 10 | MT 9 | MT 8 | MT 7 | MT 6 | MT 5 | MT 4 | MT 3 | MT 2 | MT 1 | MT 0 |
|---|---|---|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 | 0 | 0 | 0 | 1 |
| 0 | 0 | 0 | 1 | 0 | 0 | 0 | 0 | 0 | 0 | 0 | 0 | 0 | 0 | 0 | 0 | 0 | 0 | 1 | 0 |
| 0 | 0 | 1 | 0 | 0 | 0 | 0 | 0 | 0 | 0 | 0 | 0 | 0 | 0 | 0 | 0 | 0 | 1 | 0 | 0 |
| 0 | 0 | 1 | 1 | 0 | 0 | 0 | 0 | 0 | 0 | 0 | 0 | 0 | 0 | 0 | 0 | 1 | 0 | 0 | 0 |
| 0 | 1 | 0 | 0 | 0 | 0 | 0 | 0 | 0 | 0 | 0 | 0 | 0 | 0 | 0 | 1 | 0 | 0 | 0 | 0 |
| 0 | 1 | 0 | 1 | 0 | 0 | 0 | 0 | 0 | 0 | 0 | 0 | 0 | 0 | 1 | 0 | 0 | 0 | 0 | 0 |
| 0 | 1 | 1 | 0 | 0 | 0 | 0 | 0 | 0 | 0 | 0 | 0 | 0 | 1 | 0 | 0 | 0 | 0 | 0 | 0 |
| 0 | 1 | 1 | 1 | 0 | 0 | 0 | 0 | 0 | 0 | 0 | 0 | 1 | 0 | 0 | 0 | 0 | 0 | 0 | 0 |
| 1 | 0 | 0 | 0 | 0 | 0 | 0 | 0 | 0 | 0 | 0 | 1 | 0 | 0 | 0 | 0 | 0 | 0 | 0 | 0 |
| 1 | 0 | 0 | 1 | 0 | 0 | 0 | 0 | 0 | 0 | 1 | 0 | 0 | 0 | 0 | 0 | 0 | 0 | 0 | 0 |
| 1 | 0 | 1 | 0 | 0 | 0 | 0 | 0 | 0 | 1 | 0 | 0 | 0 | 0 | 0 | 0 | 0 | 0 | 0 | 0 |
| 1 | 0 | 1 | 1 | 0 | 0 | 0 | 0 | 1 | 0 | 0 | 0 | 0 | 0 | 0 | 0 | 0 | 0 | 0 | 0 |
| 1 | 1 | 0 | 0 | 0 | 0 | 0 | 1 | 0 | 0 | 0 | 0 | 0 | 0 | 0 | 0 | 0 | 0 | 0 | 0 |
| 1 | 1 | 0 | 1 | 0 | 0 | 1 | 0 | 0 | 0 | 0 | 0 | 0 | 0 | 0 | 0 | 0 | 0 | 0 | 0 |
| 1 | 1 | 1 | 0 | 0 | 1 | 0 | 0 | 0 | 0 | 0 | 0 | 0 | 0 | 0 | 0 | 0 | 0 | 0 | 0 |
| 1 | 1 | 1 | 1 | 1 | 0 | 0 | 0 | 0 | 0 | 0 | 0 | 0 | 0 | 0 | 0 | 0 | 0 | 0 | 0 |

Figure 13A:
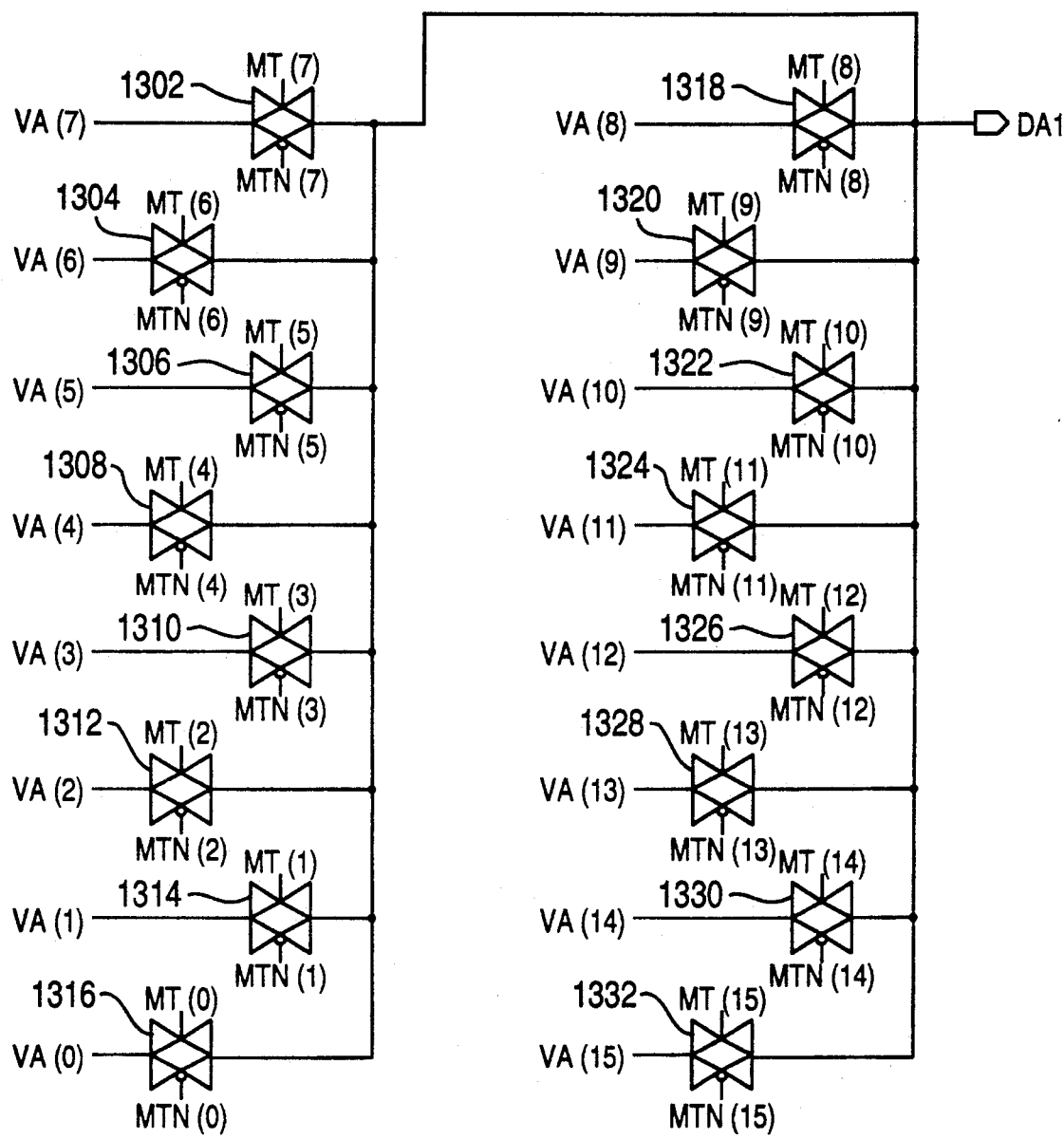
FIG. 13a is a logic diagram of four-bit DAC circuitry for use in the ADC of FIG. 8.

In FIG. 13a, the signals MT(0) through MT(15) are applied as control signals to respectively different ones of the transmission gates 1302 through 1332. These gates are coupled to selectively pass respectively different ones of the reference voltages VA(0) through VA(15) produced by the network 1010, shown in FIG. 10a, as the analog output signal DA1.

TABLE 4

| D5 | D4 | D04 | D3 | D2 | NT 19 | NT 18 | NT 17 | NT 16 | NT 15 | NT 14 | NT 13 | NT 12 | NT 11 | NT 10 | NT 9 | NT 8 | NT 7 | NT 6 | NT 5 | NT 4 | NT 3 | NT 2 | NT 1 | NT 0 |
|---|---|---|---|---|---|---|---|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 1 |
| 0 | 0 | 0 | 0 | 1 | 0 | 0 | 0 | 0 | 0 | 0 | 0 | 0 | 0 | 0 | 0 | 0 | 0 | 0 | 0 | 0 | 0 | 0 | 1 | 0 |
| 0 | 0 | 0 | 1 | 0 | 0 | 0 | 0 | 0 | 0 | 0 | 0 | 0 | 0 | 0 | 0 | 0 | 0 | 0 | 0 | 0 | 0 | 1 | 0 | 0 |
| 0 | 0 | 0 | 1 | 1 | 0 | 0 | 0 | 0 | 0 | 0 | 0 | 0 | 0 | 0 | 0 | 0 | 0 | 0 | 0 | 0 | 1 | 0 | 0 | 0 |
| 0 | 0 | 1 | 0 | 0 | 0 | 0 | 0 | 0 | 0 | 0 | 0 | 0 | 0 | 0 | 0 | 0 | 0 | 0 | 0 | 1 | 0 | 0 | 0 | 0 |
| 0 | 0 | 1 | 0 | 1 | 0 | 0 | 0 | 0 | 0 | 0 | 0 | 0 | 0 | 0 | 0 | 0 | 0 | 0 | 1 | 0 | 0 | 0 | 0 | 0 |
| 0 | 0 | 1 | 1 | 0 | 0 | 0 | 0 | 0 | 0 | 0 | 0 | 0 | 0 | 0 | 0 | 0 | 0 | 1 | 0 | 0 | 0 | 0 | 0 | 0 |
| 0 | 0 | 1 | 1 | 1 | 0 | 0 | 0 | 0 | 0 | 0 | 0 | 0 | 0 | 0 | 0 | 0 | 1 | 0 | 0 | 0 | 0 | 0 | 0 | 0 |
| 0 | 1 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 |
| 0 | 1 | 0 | 0 | 1 | 0 | 0 | 0 | 0 | 0 | 0 | 0 | 0 | 0 | 0 | 1 | 0 | 0 | 0 | 0 | 0 | 0 | 0 | 0 | 0 |
| 0 | 1 | 0 | 1 | 0 | 0 | 0 | 0 | 0 | 0 | 0 | 0 | 0 | 0 | 1 | 0 | 0 | 0 | 0 | 0 | 0 | 0 | 0 | 0 | 0 |
| 0 | 1 | 0 | 1 | 1 | 0 | 0 | 0 | 0 | 0 | 0 | 0 | 0 | 1 | 0 | 0 | 0 | 0 | 0 | 0 | 0 | 0 | 0 | 0 | 0 |

TABLE 4-continued

| D5 | D4 | D04 | D3 | D2 | NT19 | NT18 | NT17 | NT16 | NT15 | NT14 | NT13 | NT12 | NT11 | NT10 | NT9 | NT8 | NT7 | NT6 | NT5 | NT4 | NT3 | NT2 | NT1 | NT0 |
|----|----|-----|----|----|------|------|------|------|------|------|------|------|------|------|-----|-----|-----|-----|-----|-----|-----|-----|-----|-----|
| 0 | 1 | 1 | 0 | 0 | 0 | 0 | 0 | 0 | 0 | 0 | 0 | 0 | 0 | 0 | 0 | 1 | 0 | 0 | 0 | 0 | 0 | 0 | 0 | 0 |
| 0 | 1 | 1 | 0 | 1 | 0 | 0 | 0 | 0 | 0 | 0 | 0 | 0 | 0 | 0 | 1 | 0 | 0 | 0 | 0 | 0 | 0 | 0 | 0 | 0 |
| 0 | 1 | 1 | 1 | 0 | 0 | 0 | 0 | 0 | 0 | 0 | 0 | 0 | 0 | 1 | 0 | 0 | 0 | 0 | 0 | 0 | 0 | 0 | 0 | 0 |
| 0 | 1 | 1 | 1 | 1 | 0 | 0 | 0 | 0 | 0 | 0 | 0 | 0 | 1 | 0 | 0 | 0 | 0 | 0 | 0 | 0 | 0 | 0 | 0 | 0 |
| 1 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 |
| 1 | 0 | 0 | 0 | 1 | 0 | 0 | 0 | 0 | 0 | 0 | 0 | 0 | 0 | 0 | 1 | 0 | 0 | 0 | 0 | 0 | 0 | 0 | 0 | 0 |
| 1 | 0 | 0 | 1 | 0 | 0 | 0 | 0 | 0 | 0 | 0 | 0 | 0 | 0 | 1 | 0 | 0 | 0 | 0 | 0 | 0 | 0 | 0 | 0 | 0 |
| 1 | 0 | 0 | 1 | 1 | 0 | 0 | 0 | 0 | 0 | 0 | 0 | 0 | 1 | 0 | 0 | 0 | 0 | 0 | 0 | 0 | 0 | 0 | 0 | 0 |
| 1 | 0 | 1 | 0 | 0 | 0 | 0 | 0 | 0 | 0 | 0 | 0 | 1 | 0 | 0 | 0 | 0 | 0 | 0 | 0 | 0 | 0 | 0 | 0 | 0 |
| 1 | 0 | 1 | 0 | 1 | 0 | 0 | 0 | 0 | 0 | 0 | 1 | 0 | 0 | 0 | 0 | 0 | 0 | 0 | 0 | 0 | 0 | 0 | 0 | 0 |
| 1 | 0 | 1 | 1 | 0 | 0 | 0 | 0 | 0 | 0 | 1 | 0 | 0 | 0 | 0 | 0 | 0 | 0 | 0 | 0 | 0 | 0 | 0 | 0 | 0 |
| 1 | 0 | 1 | 1 | 1 | 0 | 0 | 0 | 0 | 1 | 0 | 0 | 0 | 0 | 0 | 0 | 0 | 0 | 0 | 0 | 0 | 0 | 0 | 0 | 0 |
| 1 | 1 | 0 | 0 | 0 | 0 | 0 | 0 | 0 | 0 | 0 | 1 | 0 | 0 | 0 | 0 | 0 | 0 | 0 | 0 | 0 | 0 | 0 | 0 | 0 |
| 1 | 1 | 0 | 0 | 1 | 0 | 0 | 0 | 0 | 0 | 1 | 0 | 0 | 0 | 0 | 0 | 0 | 0 | 0 | 0 | 0 | 0 | 0 | 0 | 0 |
| 1 | 1 | 0 | 1 | 0 | 0 | 0 | 0 | 0 | 1 | 0 | 0 | 0 | 0 | 0 | 0 | 0 | 0 | 0 | 0 | 0 | 0 | 0 | 0 | 0 |
| 1 | 1 | 0 | 1 | 1 | 0 | 0 | 0 | 1 | 0 | 0 | 0 | 0 | 0 | 0 | 0 | 0 | 0 | 0 | 0 | 0 | 0 | 0 | 0 | 0 |
| 1 | 1 | 1 | 0 | 0 | 0 | 0 | 0 | 1 | 0 | 0 | 0 | 0 | 0 | 0 | 0 | 0 | 0 | 0 | 0 | 0 | 0 | 0 | 0 | 0 |
| 1 | 1 | 1 | 0 | 1 | 0 | 0 | 1 | 0 | 0 | 0 | 0 | 0 | 0 | 0 | 0 | 0 | 0 | 0 | 0 | 0 | 0 | 0 | 0 | 0 |
| 1 | 1 | 1 | 1 | 0 | 0 | 1 | 0 | 0 | 0 | 0 | 0 | 0 | 0 | 0 | 0 | 0 | 0 | 0 | 0 | 0 | 0 | 0 | 0 | 0 |
| 1 | 1 | 1 | 1 | 1 | 1 | 0 | 0 | 0 | 0 | 0 | 0 | 0 | 0 | 0 | 0 | 0 | 0 | 0 | 0 | 0 | 0 | 0 | 0 | 0 |

Figure 13B:
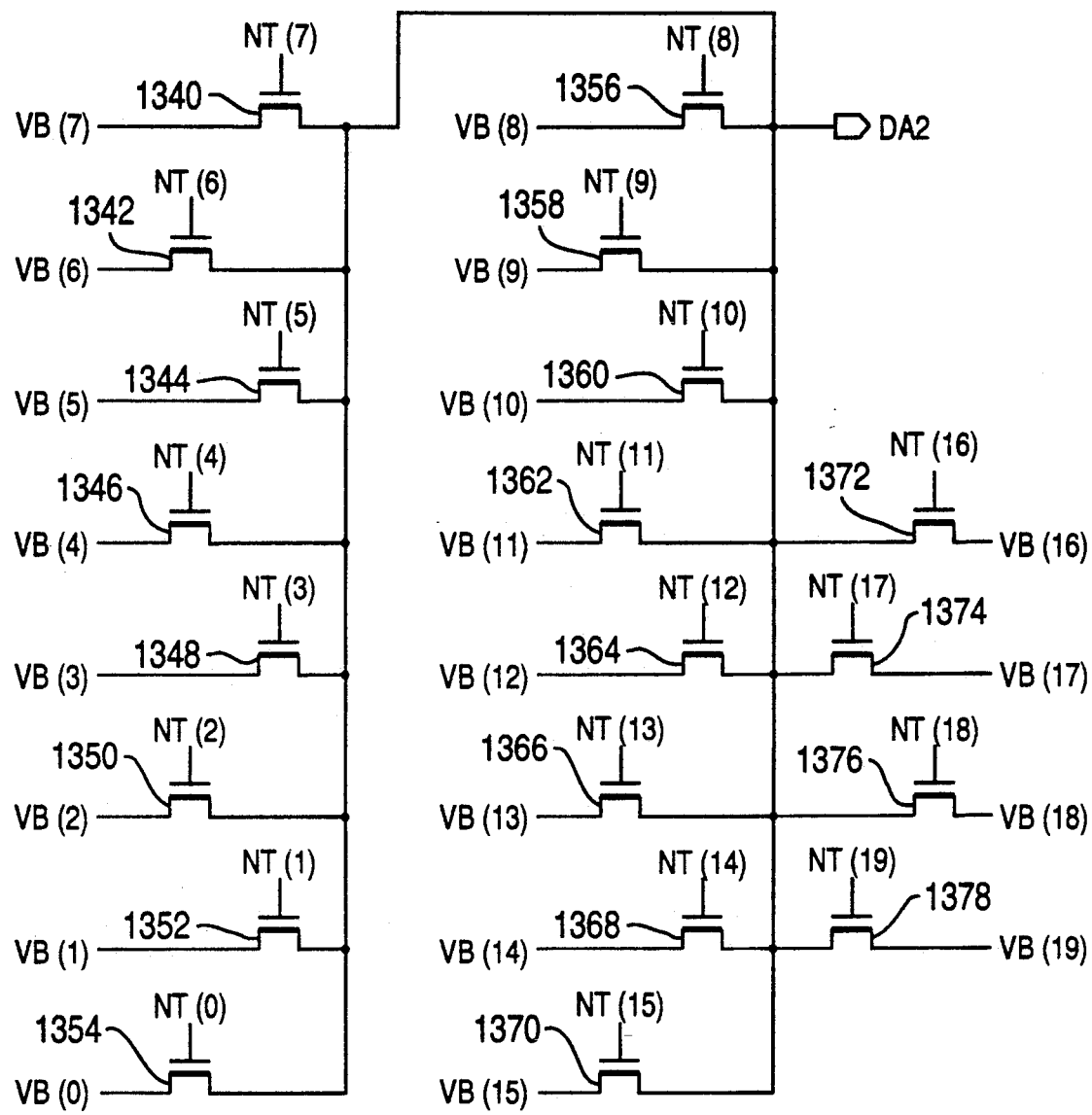
FIG. 13b is a logic diagram of five-bit DAC circuitry for use in the ADC of FIG. 8.

In FIG. 13b the DAC 804 which generates the analog signal DA2 from the output signals D(2), D(3), D(04), D(4) and D(5) of the SAR 42 includes 20 transmission gates 1340 through 1378 which selectively pass, as the output signal DA2, one of the respective signals VB(0) through VB(19) developed by the reference voltage divider 1012. The input signals to these transmission gates are 20 control signals, NT(0) through NT(19) which are generated from the signals D(2) through D(5), the latched output signals of the SAR 42, by logic circuitry (not shown) internal to the DAC 804 which performs the function specified in the truth table of Table 4.

The logic function illustrated by Table 4 compensates for the offset which is added via the MD(04) position in order to cause the signal applied to the capacitance at the input to the auto-zero comparator 40' to settle faster. Duplicated states of the signals NT(0) through NT(19) represent digital values which may be produced in response to the same analog input values.

As shown in FIG. 13b, the signals NT(0) through NT(19) are applied as control signals to respectively different ones of the transmission gates 1340 through 1378. These gates are coupled to selectively pass respectively different ones of the reference voltages VB(0) through VA(19) produced by the network 1012, shown in FIG. 10a, as the analog output signal DA2.

Figure 13C:
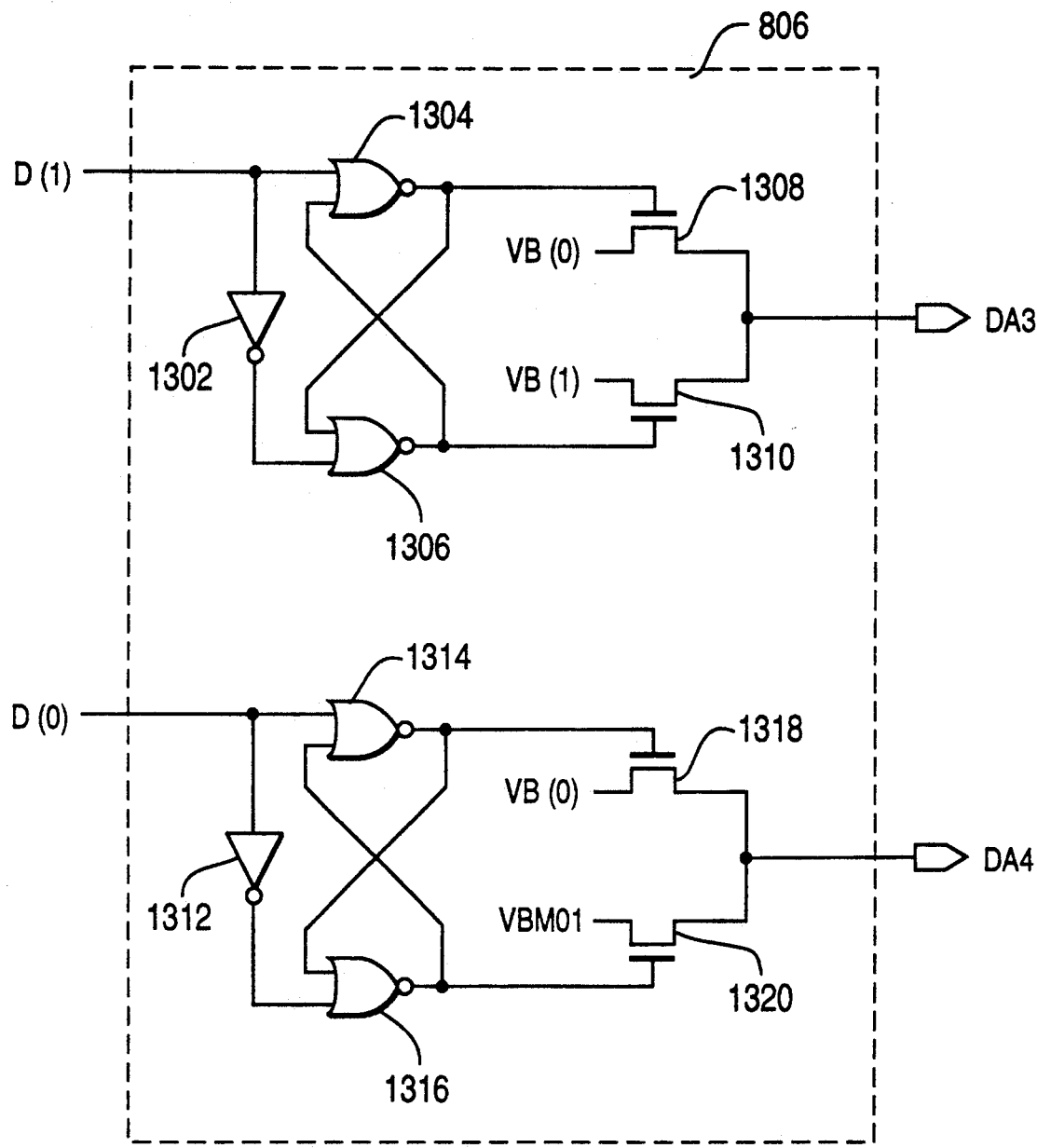
FIG. 13c is a logic diagram of two-bit ADC circuitry for use in the ADC of FIG. 8.

FIG. 13c is a logic diagram, partly in schematic diagram form, of a two-bit DAC suitable for use as the DAC 806 of FIG. 8. The output signal D(1) of the SAR 42, is applied to a latch formed by an inverter 1302 and two cross-coupled NOR gates 1304 and 1306. The normal and inverted output signals, provided by the latch, control respective ones of two pass-transistor transmission gates 1308 and 1310 to pass either the reference voltage VB(0) [D(1)=0] or the reference voltage VB(1) [D(1)=1] as the analog output signal DA3. A second circuit, identical to the circuit described above, is used to generate the analog output signal DA4 from the output signal D(0) of the SAR 42 and the reference voltages VB(0) and VBM01 generated by the divider circuit 1012, shown in FIG. 10.

It is noted that, in the exemplary embodiment, the step size between reference voltages VB(1) and VBM1 and between reference voltages VBM1 and V(0) is one-half of the step size between any two other adjacent taps on the network 1012. This difference in step size compensates for the capacitors 914 and 916 of FIG. 9, which are used to couple the respective signals DA3 and DA4 to the auto-zero comparator 40'. In the exemplary embodiment, these capacitors have one-half of the capacitance of the capacitor 912 which is used to couple the signal DA2 from the DAC 804 to the comparator 40'.

In the configuration shown in FIGS. 8-13c, the ADC automatically generates a bias potential, BIAS, for the input amplifier 920 and automatically generates gain compensation through the gain adjust circuit 985 during a calibration interval prior to each sampling interval. These adjustments to the circuit allow the ADC to accurately generate digital values representing analog signal levels independent of expected process variations in the manufacturing process and of component ageing.

FIG. 14 is a block diagram of another alternate embodiment of the subject invention. This exemplary ADC converts analog input signals applied to the input terminal VIN into 12-bit digital sampled data signals. Each of the ADCs 18'' includes a modified auto-zero comparator 40'', a 13-bit successive approximation register 42', and two 4-bit DACs 802 and 806' and two five-bit DACs 804 and 804'. In addition, the circuitry shown in FIG. 14 includes a clock and phase timing circuit 36' and a voltage reference divider 810'.

In this exemplary embodiment, the divider 810' has the same basic structure as the circuit described above with reference to FIGS. 10a and 10b. The structure of the voltage divider circuit 1010 is changed, however, to provide 20 reference voltage levels VA(0) through VA(19) instead of the 16 levels provided in the circuit shown in FIG. 10a. This modification is well within the capability of one of ordinary skill in the art and so is not described in detail.

The four-bit DAC 802 may be identical to the ADC 802 described above in reference to FIG. 13a. It uses four digital output values, D(8) through D(11) provided by the SAR 42', and 16 voltage reference levels, VA(0) through VA(15) provided by the divider 810' to produce an analog output signal DA1 which is applied to the auto-zero comparator 40''. The DAC 804', which may be identical to the DAC 804 shown in FIG. 13b, uses five digital output values [D(4), D(5), D(06), D(6) and D(7)] provided by the SAR 42' and 20 voltage reference levels VA(0) through VA(19) provided by the voltage reference divider circuit 810' to produce an analog output signal DA2 which is applied to the comparator 40". The DAC 804, which may also be identical to the DAC 804 described above with reference to FIG. 13b, uses 20 voltage reference levels VB(0) through VB(19) provided by the voltage reference divider circuit 810' and uses the same five digital input values [D(4), D(5), D(06), D(6) and D(7)] which are processed by the DAC 804'. This DAC, however, produces an analog output signal DA2T for application to the comparator 40". The output signals DA2 and DA2T of the respective DACs 804' and 804 are analog signals which differ in magnitude by a factor of 16 due to the differing magnitude of the respective voltage reference levels. The last of the four DACs 806' uses four digital input values, D0 through D3 and five reference voltage levels, VB(0) through VB(4) provided by the divider 810' to produce four analog output signals, DA3, DA4, DA5 and DA6, one for each of the four LSBs of the digital value provided by the SAR 42'.

The auto-zero comparator 40" is very similar to the comparator 40' described above with reference to FIG. 9. The principal differences between the two comparators are the addition of two capacitors 1502 and 1504 to couple the analog signals DA5 and DA6 to the comparator 40" and the different input connection by which the signal DA2T is coupled to the gain adjust circuit 985'. In addition, the capacitor ratios used in this embodiment are different from those used in embodiment of FIGS. 8 and 9. In the exemplary comparator 40", if the capacitor 910' has a capacitance of 16C, each of the capacitors 912, 914, 916, 1502 and 1505 has a capacitance of C and the capacitor 918' has a capacitance of 3C. In this exemplary embodiment, C=40 fF.

Figure 15:
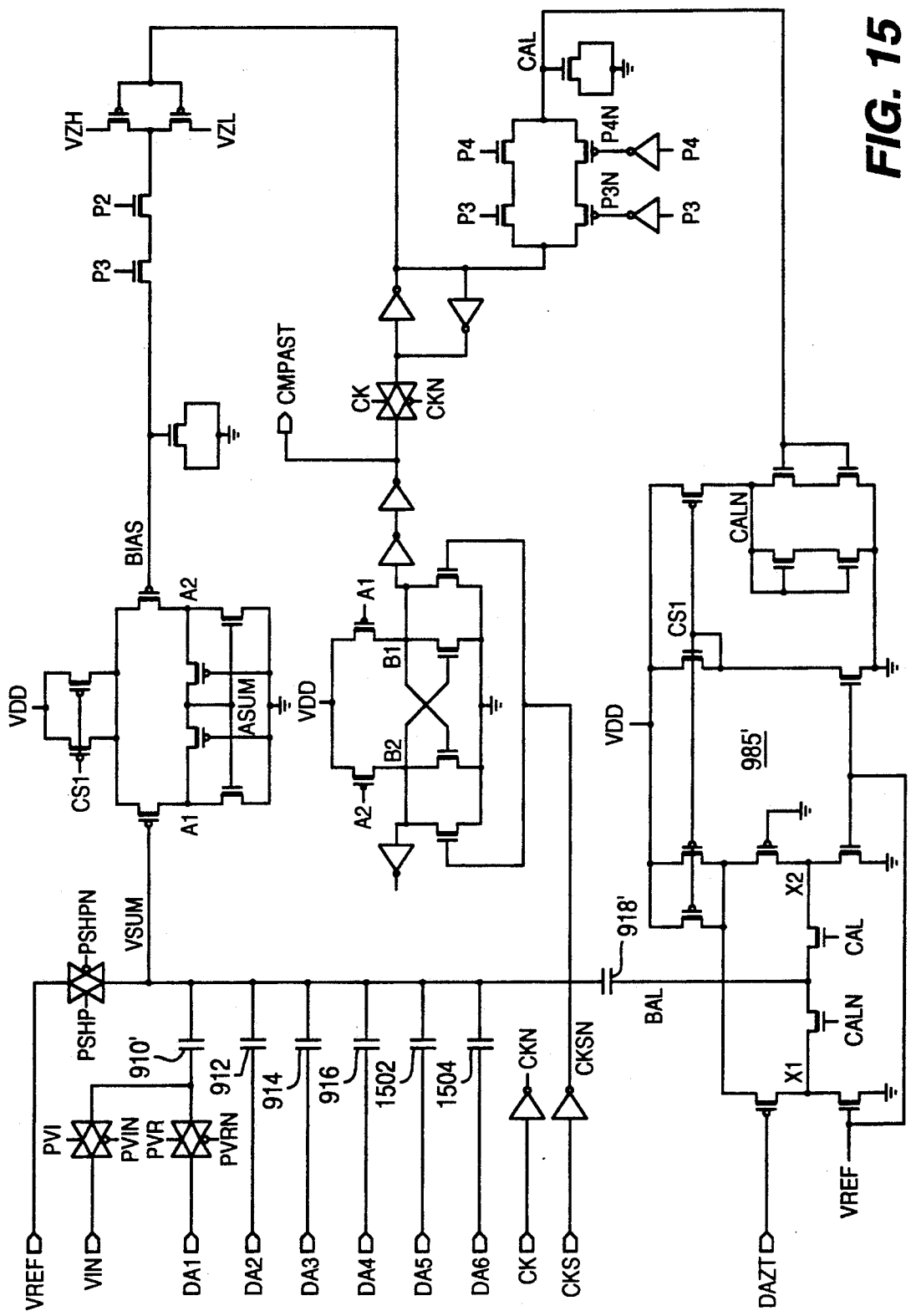
FIG. 15 is a schematic diagram of an auto-zero comparator for use in the ADC of FIG. 14.

The gain adjust circuit 985', in the embodiment shown in FIG. 15 operates by balancing the analog output signal DA2 produced by the DAC 804' against the output signal DA2T produced by the DAC 804. As described above, these signals are derived from reference voltages, VA and VB, provided by respectively different voltage reference dividers and, so, differ in amplitude by a factor of 16. As in the embodiment described above, the gain adjust circuit 985' acts to compensate for process variations which may affect the relative capacitances of the capacitors 910', 912', 914', 916', 1502 and 1504, and to compensate for any scale factor errors between the reference voltages VA and VB produced by the divider 810'.

It is to be understood that the embodiments of architecture and circuits described herein are illustrative of the general principles of the invention. Modifications may readily be devised by those skilled in the art without departing from the spirit and scope of the invention. For example, circuit elements may be changed and the value of offset compensation may be different from that shown. Moreover the invention is not restricted to a particular speed or resolution or number of bits in a word, or to the number of ADCs in a parallel assembly. Still further, the ADCs 18, 18' or 18", with only one of same being used, does not require a MUX 28 and includes a format converter, adder, 32 so as to provide a standard output format.

What is claimed is:

1. An analog to digital converter (ADC) having N bit resolution comprising:

an N+1 bit successive approximation register (SAR) having an input terminal and N+1 output terminals with N bit resolution; a first digital to analog converter (DAC) having an output terminal which provides an output signal and having an input terminal coupled to M of the N+1 output terminals of the SAR, where M is less than N;

a second DAC having an output terminal which provides an output signal and having P input terminals which are coupled to P output terminals of the N+1 bit SAR of less significance than the M output terminals coupled to the first DAC, where M+P is not greater than N+1; and a comparator having a first input terminal adapted to receive an analog signal, a second input terminal coupled to the output terminal of the first DAC, a third input terminal coupled to the output terminal of the second DAC, a calibration input terminal coupled to the output terminal of the second DAC and an output terminal coupled to an input terminal of the N+1 bit SAR.

2. The ADC of claim 1 further comprising adding means, having input terminals coupled to the output terminals of the N+1 bit SAR, for adding the (M+1)th most significant bit from the output terminals of the N+1 bit successive approximation register, as a carry input value, to the M most significant bits from the output terminals of the N+1 bit SAR and for concatenating the resulting M-bit value, as the more significant bits, with the N−M least significant bits from the output terminals of the N+1 bit SAR so as to generate a output value which comprises N bits.

3. The ADC of claim 1, wherein said comparator further comprises variable gain amplifier means, coupled to receive the output signal of the second DAC for generating an attenuated version thereof; and means for combining the respective output signals of the first and second DACs with the attenuated signal provided by the variable gain amplifier to generate a calibrated analog comparison signal for the ADC.

4. The ADC of claim 3 further comprising means for coupling the output terminal of the second DAC to the calibration input terminal of the comparator comprising:

a first capacitor coupled between the output terminal of the second DAC and the calibration input terminal of the comparator; and a second capacitor coupled between the calibration input terminal of the comparator and a source of reference potential.

5. The ADC of claim 1 further including:

a first source of reference potentials;

a second source of reference potentials, wherein the reference potentials provided by the second source of reference potentials are related to the corresponding potentials provided by the first source of reference potentials in a nominal ratio of 1 to S, where S is positive real number; and wherein:

the first DAC includes R reference input terminals coupled to receive respective reference potentials from the first source of reference potentials, where R is an integer; and the second DAC includes:

a first component DAC having an output terminal coupled to the third input terminal of the comparator, P input terminals coupled to the P output terminals of the SAR and Q reference input terminals coupled to receive respective reference potentials from the first source of reference potentials; and a second component DAC having an output terminal coupled to the calibration input terminal of the comparator, P input terminals coupled to the P output terminals of the SAR and Q reference input terminals coupled to receive respective reference potentials from the second source of reference potentials; and the comparator includes calibration means, for combining, with the signals applied to the second and third input terminals, an attenuated version of the signal applied to the calibration input terminal to correct for any variance in the nominal ratio between the reference potentials provided by the respective first and second sources of reference potentials.

6. An analog to digital converter (ADC) comprising:

comparator means having input means for receiving an analog input voltage and having an output terminal to which it applies a binary bit output signal the value of which depends on whether the analog input voltage is above or below a set voltage;

referencing means for referencing the set voltage to a master voltage reference;

successive approximation register (SAR) means for receiving N output signal values from the comparator means and for generating, from N output signal values, successive partial digital values representing said analog input voltage;

timing means for driving the comparator means and the register means through a complete cycle of operation during which the N output signals are successively provided by the comparator means to the SAR means;

digital to analog converter (DAC) means, coupled to the SAR means, for providing in accordance with a weighted partial sum of bits from the SAR means, an output analog voltage representing the digital value held by the SAR means;

feedback means for applying the output analog voltage of the DAC means to the input means of the comparator; and calibrating means, responsive to the output signal of the comparator during a predetermined time interval, for generating an analog signal which, when added to the analog output signal of the DAC, compensates for errors in the DAC to maintain accurate calibration of the output signal of the DAC relative to a master reference voltage.

7. A comparator for an analog to digital converter (ADC) comprising:

latch means, having first and second signal input terminals which receiving respective first and second input signals, and an output terminal which providing either a high or low output signal at the output terminal depending on whether the first input signal is higher or lower than the second input signal;

clock means to reset the latch means for a switching operation;

input means for generating, from a voltage to be sampled or a reference voltage and a bias voltage, the first and second input signals for the latch means;

auto bias means for determining the bias voltage to be applied to the input means to achieve a desired level of sensitivity and a desired switching speed, the auto bias means being coupled between the latch output terminal and the input means; and voltage reference feedback means, comprising the latch means, the input means and the auto bias means for referencing the bias voltage applied to the input means to an accurately determined reference voltage such that the latch means switches between high and low in response to an input voltage, applied to the input means, which closely corresponds to the reference voltage.

8. The comparator of claim 7 wherein the auto bias means comprises third feedback means coupled between the output terminal of the latch and the input means, the third feedback means being actuated by the timing means after the first switch in the interconnecting means has applied a reference voltage to the terminal of the interconnecting means, such that the bias voltage applied to the input means is accurately set at a desired value which improves both accuracy and speed of operation of the latch relative to other values of the bias voltage.

9. The comparator of claim 7, wherein the input means includes a differential amplifier coupled to receive the voltage to be sampled or the reference voltage at a first input terminal and the bias voltage at a second input terminal and having first and second output terminals coupled to provide the respective first and second input signals to the latch means.

10. The comparator of claim 9, wherein the differential amplifier includes first and second differential amplifier stages each having first and second input terminals and first and second output terminals, wherein:

the first input terminal of the first differential amplifier stage is coupled to receive the voltage to be sampled or the reference voltage and the second input terminal of the first differential amplifier stage is coupled to receive the bias voltage;

the first and second output terminals of the first differential amplifier stage are coupled to the respective second and first input terminals of the second differential amplifier stage; and the first and second output terminals of the second differential amplifier stage are coupled to the respective second and first input terminals of the latch means.

11. An analog to digital converter (ADC) having N bit resolution comprising:

an N+1 bit successive approximation register (SAR) having an input terminal and N+1 output terminals for holding N+1 binary bit values;

first and second sources of reference potentials; a first digital to analog converter (DAC) having an output terminal and having an input terminal coupled to a first sub-set of M of the N+1 output terminals of the SAR, where M is an integer less than N+1 and having R reference input terminals coupled to receive respective reference potentials from the first source of reference potentials, where R is an integer;

a second DAC having an output terminal, having an integer P digital input terminals which are coupled to P output terminals of the N+1 bit SAR where M+P is less than N+1 and having Q reference input terminals coupled to receive respectively different reference potentials from the second source of reference potentials, where Q is an integer; and a comparator having a first input terminal adapted to sample an analog signal during a plurality of predetermined sampling intervals, a second input terminal coupled to the output of the first DAC, a third input terminal coupled to the output terminal of the second DAC, a correction circuit, coupled to the third input terminal for generating a correction signal which, when combined with the output signal of the first DAC, compensates for inconsistencies in the respective reference potentials provided by the first and second sources of reference potentials.

12. The ADC of claim 11 wherein the correction circuit includes a variable gain amplifier which generates, as said correction signal, a gain-adjusted version of the output signal of the second DAC.

13. The ADC of claim 12 wherein the variable gain amplifier determines a gain adjustment factor to be applied to the output signal of the second DAC during predetermined time intervals occurring prior to each respective sampling interval.

14. The ADC of claim 11 further comprising:
a first capacitor which couples the output signal of the first DAC to the comparator wherein said first capacitor has a first nominal capacitance value; and
a second capacitor which couples the output signal of the second DAC to the comparator, wherein the second capacitor has a second nominal capacitance value;
wherein, the correction signal generated by the correction circuit of the comparator compensates for comparison errors resulting from deviations in said first and second capacitors from said respective first and second nominal capacitance values.

15. The ADC of claim 11 further including:
an input amplifier having a first input terminal coupled to receive said analog signal, a second input terminal coupled to receive a bias signal and first and second output terminals for providing respective first and second differentially amplified versions of said analog signal;
a differential latch, having first and second input terminals coupled to the first and second output terminals of the input amplifier and having an output terminal which provides an output signal of the comparator; and
a low-pass filter, coupled to the differential latch and responsive to the output signal provided thereby during predetermined intervals prior to each sampling interval for generating the bias signal for the input amplifier.

16. An analog to digital converter (ADC) having N bit resolution comprising:
a successive approximation register (SAR) having an input terminal and at least N output terminals with N bit resolution; a voltage reference source which provides L voltage reference values, the voltage reference source including: a first resistor ladder, having a first end and a second end coupled to respective first and second sources of reference potential, and having a plurality of serially connected resistors ordinally numbered first through Lth from the first end to the second end; and
a second resistor ladder, having a first end and a second end coupled to the second and first sources of reference potential, respectively, and having a plurality of serially connected resistors ordinally numbered first through Lth from the first end of the second resistor ladder to the second end of the second resistor ladder;
wherein, the first resistor in the first resistor ladder is connected in parallel with the Lth resistor of the second resistor ladder;
a digital to analog converter (DAC) having L input terminals coupled to receive the L voltage reference values from the voltage reference source and an output terminal which provides an output signal and having a plurality of input terminals coupled at least a portion of the N output terminals of the SAR;
a comparator having a first input terminal adapted to receive an analog signal, a second input terminal coupled to the output terminal of the DAC and an output terminal coupled to an input terminal of the SAR.

* * * * *